United States Patent [19]

Noishiki et al.

[11] Patent Number: 5,367,530
[45] Date of Patent: Nov. 22, 1994

[54] SEMICONDUCTOR LASER APPARATUS

[75] Inventors: Yoshio Noishiki, Kurayoshi; Hirofumi Yoneyama; Yoshimasa Kishimoto, both of Tottori, all of Japan

[73] Assignees: Sanyo Electric Co., Ltd., Osaka; Tottori Sanyo Electric Co., Ltd., Tottori, both of Japan

[21] Appl. No.: 216,508

[22] Filed: Mar. 22, 1994

Related U.S. Application Data

[63] Continuation of Ser. No. 68,066, May 27, 1993, abandoned.

[30] Foreign Application Priority Data

| | | | |
|---|---|---|---|
| May 29, 1992 | [JP] | Japan | 4-138696 |
| Jul. 29, 1992 | [JP] | Japan | 4-202377 |
| Jul. 31, 1992 | [JP] | Japan | 4-205327 |

[51] Int. Cl.[5] .................................. H01S 3/18
[52] U.S. Cl. ........................... 372/43; 257/668; 257/787
[58] Field of Search .............. 372/43; 250/215, 239; 257/666, 668, 676, 787

[56] References Cited

U.S. PATENT DOCUMENTS

| | | | |
|---|---|---|---|
| 4,375,067 | 2/1983 | Kitamura | 372/43 |
| 4,630,278 | 12/1986 | Auffret et al. | 372/43 |
| 4,834,491 | 5/1989 | Aoki et al. | 372/43 |
| 4,977,317 | 12/1990 | Iwashima | 250/239 |
| 5,065,226 | 11/1991 | Kluitmans et al. | 372/43 |
| 5,105,237 | 4/1992 | Hasegawa et al. | 372/43 |
| 5,130,531 | 7/1992 | Ito et al. | 257/432 |
| 5,140,384 | 8/1992 | Tanaka | 257/790 |

FOREIGN PATENT DOCUMENTS

| | | |
|---|---|---|
| 61-108188 | 5/1986 | Japan. |
| 2-125688 | 5/1990 | Japan. |
| 2-163985 | 6/1990 | Japan. |
| 2-266584 | 10/1990 | Japan. |
| 3-188692 | 8/1991 | Japan. |

Primary Examiner—Georgia Y. Epps
Assistant Examiner—Robert E. Wise
Attorney, Agent, or Firm—Nikaido, Marmelstein, Murray & Oram

[57] ABSTRACT

A semiconductor laser device and a beam receiving device are mounted on a lead. The beam receiving device receives a sub beam irradiated from the semiconductor laser device. At an edge of the lead, concave portions are provided for positioning with an optical part which receives a laser beam irradiated from a main irradiating surface provided at the front of the semiconductor laser device. The beam optical axis of the semiconductor laser device is situated at a position higher than the position of a beam receiving surface of the beam receiving device is situated. A transparent resin covering from the rear surface of the semiconductor laser device to the beam receiving surface of the beam receiving device and containing a dispersing agent, or a molding resin made of an ultraviolet hardened resin and containing the dispersing agent is provided.

12 Claims, 27 Drawing Sheets

SEMICONDUCTOR LASER APPARATUS

This application is a continuation of application Ser. No. 08/068,066 filed May 27, 1993 now abandoned.

BACKGROUND OF THE INVENTION

1. Field of the Invention

The present invention relates to a semiconductor laser apparatus, and more particularly, to a semiconductor laser apparatus where a semiconductor laser device and a beam receiving device for monitoring an output of the semiconductor laser device are provided on the same lead.

2. Description of the Prior Art

In recent years, a great number of improvements have been made in the semiconductor laser apparatus. Of the improvements, a semiconductor laser apparatus shown in Japanese Patent Application No. H4-132513 by the present Applicants is shown in FIG. 1. In the figure, a beam receiving device 42 is placed on a lead 41, and a semiconductor laser device 43 is placed on the lead 41 and in front of the beam receiving device 42. Fine metallic wires are arranged between the beam receiving device 42 and another lead 45 and between the semiconductor laser device 43 and another lead 46, respectively. An insulating frame 44 is formed to partly surround the leads 41, 45 and 46. In the apparatus, an optical part 47 (e.g. a diffraction grating, a half mirror, and an objective lens) for which an accurate position relationship is required with an irradiated beam is normally arranged in front of the semiconductor laser device 43, that is, on the side toward which a main laser beam is irradiated (main irradiation direction). The optical part 47 is fixed onto a circuit board 48, and the lead 41 and the other leads 45 and 46 of the semiconductor laser apparatus are soldered onto the circuit board 48. In this semiconductor laser apparatus, however, it is difficult to solder the leads 41 and the other leads 45 and 46 onto the circuit board 48 since they are close to the optical part 47. Further, since the position of the semiconductor apparatus readily shifts at the time of the soldering, the position relationship between the irradiated beam and the optical part is not accurately held.

In laser beam printers and laser facsimile apparatuses, in order to increase the printing speed, two-beam irradiating semiconductor laser apparatuses have been used. Of such apparatuses, a semiconductor laser apparatus disclosed in *Sanyo Technical Review* Vol. 20 No. 1, published in February, 1988 is shown in FIG. 2. In FIG. 2, a heat sink 52 and a beam receiving device 53 are placed on a stem 51, and an optical guide 54 and a semiconductor laser device 55 are placed on the beam receiving device 53. The semiconductor laser device 55, which is electrically separated by a groove formed at the center of a monolithic substrate, is provided with a first beam emitting portion 56 and a second beam emitting portion 57 to upwardly emit two beams.

In order to accurately control the intensity of each beam, it is required that the beam from the rear portions of the first and second beam emitting portions 56 and 57 are provided through beam leading paths to beam receiving surfaces 58 and 59 without leaking and overlapping with each other.

In the above-described semiconductor laser apparatus, however, the cost is high for the following reasons: first, the yield is low since the two beam emitting portions 56 and 57 are formed on the monolithic semiconductor laser device 55; second, the cost of the optical guide 54 made of an insulator and having the beam leading paths for leading the beams from the semiconductor laser device 55 is high; and third, the cost of the beam receiving devices 53 having the two beam receiving surfaces 58 and 59 at positions corresponding to the beam leading paths is high, and it makes the manufacture difficult that the positioning of these parts requires much time. For these reasons, this two-beam semiconductor laser apparatus costs ten times as much as the one-beam type and therefore is not practical.

SUMMARY OF THE INVENTION

An object of the present invention is to provide a semiconductor laser apparatus where the electrical connection between the lead and the circuit board is easily made and the position shift hardly occurs.

Another object of the present invention is to improve the performance of such a semiconductor laser apparatus.

Still another object of the present invention is to provide a semiconductor laser apparatus being of low cost and easily manufactured.

To achieve the above-mentioned object, a semiconductor laser apparatus of the present invention is provided with a lead having a mount surface and a positioning means, said positioning means being provided at a periphery of the mount surface, a beam receiving device mounted on the mount surface of the lead, a semiconductor laser device arranged above the lead so that a beam optical axis thereof is situated at a position higher than a position at which a beam receiving surface of the beam receiving device is situated, said semiconductor laser device having a beam irradiating surface at each of its front and rear, a laser beam irradiated from the rear irradiating surface being led to the beam receiving surface of the beam receiving device, and an insulating frame formed to partly cover the lead so that at least the front irradiating surface of the semiconductor laser device is exposed.

According to this feature, the positioning means facilitates the positioning with the optical part. Since the front beam irradiating surface is not covered with a resin and the laser beam is directly supplied from the beam irradiating surface, the beam does not disperse, and accordingly, the irradiated beam can easily be converged.

The semiconductor laser apparatus of the present invention is further provided with the following in addition to the above-mentioned parts: another beam receiving device mounted on a rear surface of the lead; and another semiconductor laser device mounted above the reverse surface of the lead so that a center of a beam optical axis thereof is situated at a position higher than a position at which said another beam receiving device is situated, said another semiconductor laser device having a beam irradiating surface at its front and rear. The insulating frame is formed to partly cover the lead and to nip the obverse and reverse surfaces of the lead so that at least the front irradiating surface of each of the two semiconductor laser devices are exposed.

By placing a semiconductor laser device on each of the obverse and reverse surfaces of the lead as described above, two laser beams are easily obtained, and the semiconductor laser apparatus can be realized with a simple arrangement.

BRIEF DESCRIPTION OF THE DRAWINGS

These and other objects and features of this invention will become clear from the following description, taken in conjunction with the preferred embodiments with reference to the accompanied drawings in which.

DESCRIPTION OF THE PREFERRED EMBODIMENTS

Figure 3:
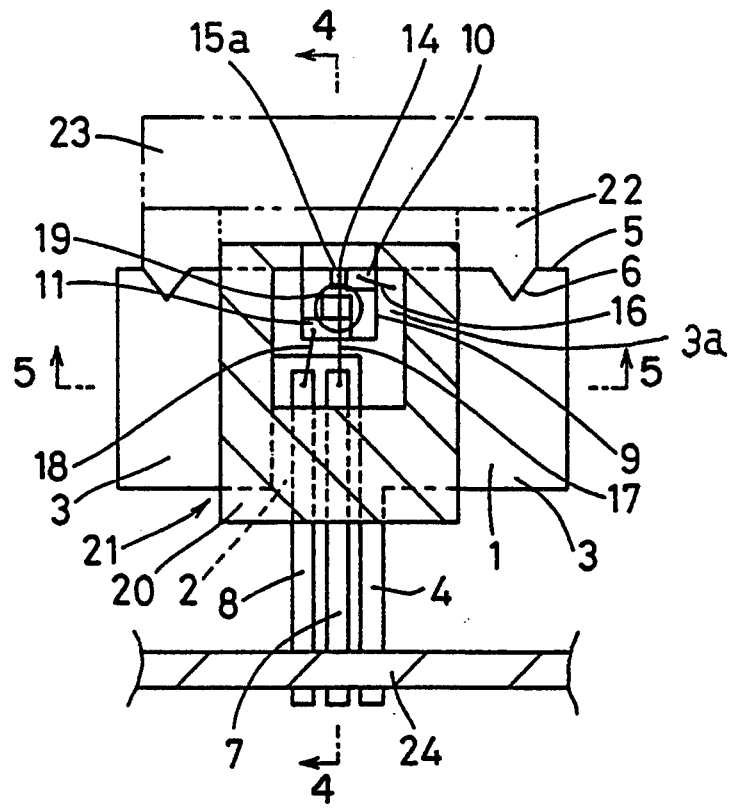
FIG. 3 is a plan cross-sectional view of a semiconductor laser apparatus according to a first embodiment of the present invention.
Figure 4:
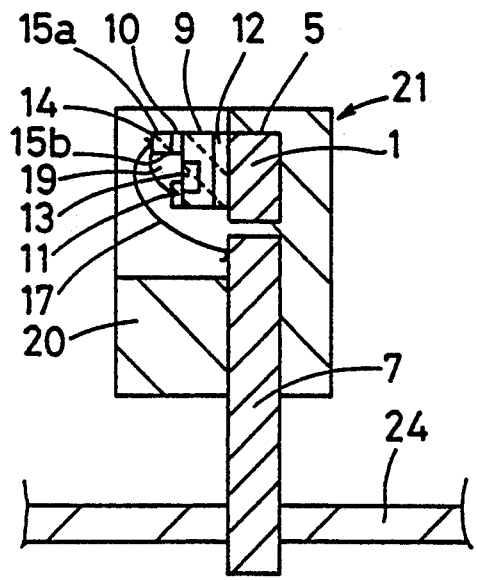
FIG. 4 is a cross-sectional view of the apparatus of FIG. 3 taken on the line A—A.
Figure 5:
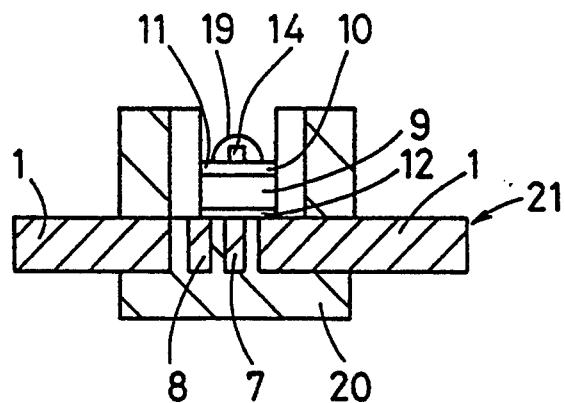
FIG. 5 is a cross-sectional view of the apparatus of FIG. 3 taken on the line B—B.

A first embodiment of the present invention will be described with reference to FIGS. 3, 4 and 5. FIG. 3 is a plan cross-sectional view of a semiconductor laser apparatus according to the first embodiment of the present invention. FIG. 4 is a cross-sectional view of the apparatus of FIG. 3 taken on the line A—A. FIG. 5 is a cross-sectional view of the apparatus of FIG. 3 taken on the line B—B. In these figures, a lead 1, which is made of a metallic material, such as copper, with a thickness of 0.2 to 1.0 mm, includes recesses 2, a rectangular portion 3 and a terminal portion 4. The lead 1 may be made of iron or aluminum. Preferably, the lead 1 is provided with V-shaped concave portions 6 on its edge 5. The concave portions 6 may be U-shaped or holes whose cross sections are U-shaped. V-shaped or U-shaped convex portions may be provided to the edge 5. The other leads 7 and 8, which are also made of a metallic material such as copper, are arranged to be opposite to the lead 1. As described above, a mount surface 3a is formed in the vicinity of the center of the lead 1, and the concave portions 6 serving as positioning means are formed in the periphery of the mount surface 3a.

A beam receiving device 9 is a photodiode or a phototransistor made of, for example, a silicon crystal of PIN structure on which a surface electrode 11 and a reverse surface electrode 12 are provided. The surface electrode 11 is formed to be in ohmic contact with a p-type diffusion region 13. The beam receiving device 9 is fixed onto the lead 1 through a conductive adhesive agent such as silver paste.

A semiconductor laser device 14 is made of, for example, a GaAlAs beam emitting layer including a linear active layer and clad layers sandwiching the active layer. On each side of the semiconductor laser device 14, which is cleaved, a reflective film is formed. The semiconductor laser device 14 is fixed through silver paste or solder onto a surface electrode 10 of the beam receiving device 9 so that its front beam irradiating surface (main beam irradiating surface) 15a is situated in the vicinity of the front edge 5 of the lead 1. The terminal portion 4 of the lead 1 extends rearward, that is, in a direction opposite to the main beam irradiation direction (forward) of the semiconductor laser device 14. The semiconductor laser device 14 also has a beam irradiating surface 15b (sub beam irradiating surface) at the rear. A laser beam irradiated from the beam irradiating surface 15b is led to a beam receiving surface of the beam receiving device 9. The laser beam is used for monitoring to control the intensity of a laser beam irradiated from the main beam irradiating surface. After converted to an electrical signal (monitoring current) at the beam receiving device 9, the beam is provided to a controlling circuit (not shown). As shown in FIG. 4, on the lead 7, the semiconductor laser device 14 is arranged so that its beam optical axis is situated at a position higher than the beam receiving surface of the beam receiving device 9.

Fine metallic wires 16, 17 and 18 are respectively arranged to connect the surface electrode 10 and the lead 1, a surface of the semiconductor laser device 14 and the lead 7, and the surface electrode 11 and the lead 8. A transparent resin 19, which is made of, for example, epoxy resin, is formed to integrally cover from the vicinity of the rear surface of the semiconductor laser device 14 to the p-type diffusion region 13 of the beam receiving device 9. By covering the above region with the transparent resin 19, the laser beam irradiated from the rear surface of the semiconductor laser device 14 is reflected by the interface between the transparent resin 19 and the atmosphere and incident on the p-type diffusion region 13 without failure. Since the quantity of the received beam increases as a result, the sensitivity of the beam receiving device 9 improves.

An insulating frame 20, which is made of, for example, polycarbonate resin or epoxy resin, is formed by transfer molding to be U-shaped so that the main beam irradiating surface 15a of the semiconductor laser device 14 is exposed, and to nip the obverse and reverse surfaces of each of the leads 7 and 8. The insulating frame 20 may be made of alumina ceramics or an insulation-processed metallic material. The above-described parts constitute a semiconductor laser apparatus 21.

The semiconductor laser apparatus 21 is fixed onto a supporter 22 so that convex portions (or concave portions) formed on the supporter 22 and the concave portions (or the convex portions) formed at the edge 5 of the lead 1 engage with each other. An optical part 23 (e.g. a diffraction grating, a half mirror, and an objective lens) is provided on the side toward which the semiconductor laser device 14 irradiates a main laser beam. And at need, the terminal portion 4 of the lead 1 and the terminal portions of the leads 7 and 8 are electrically connected to a circuit board 24 through soldering.

Figure 6:
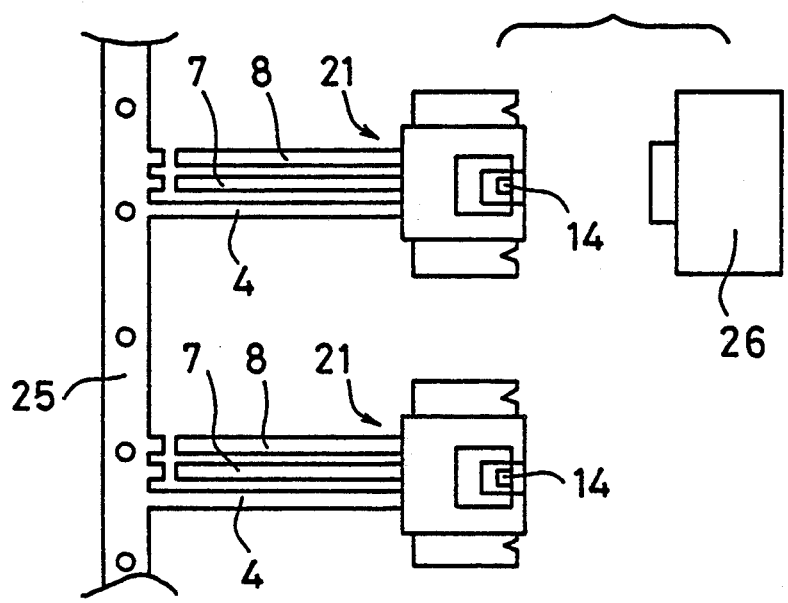
FIG. 6 is a view for explaining a testing method for the semiconductor laser apparatus according to the first embodiment.

Subsequently, a test method for the semiconductor laser apparatus 21 will be described with reference to FIG. 6. FIG. 6 is a view for explaining the tests for the semiconductor laser apparatus 21 according to the first embodiment of the present invention. In the figure, a plurality of semiconductor laser apparatuses 21 are connected to a lead frame 25 by the lead 4 and the other leads 7 and 8. The terminal portions of the leads 7 and 8 are cut off the lead frame 25 by press cutting in an automatic operation. Probes of a tester 26 are connected to the terminal portion 4 of the lead 1, the terminal portion of the lead 7 and the terminal portion of the lead 8, respectively. Tests on characteristics such as a current-to-optical output characteristic, a current-to-monitoring current (of the beam receiving device) characteristic and an oscillation spectrum distribution are made by the tester 26. After the tests, the tip of the terminal portion 4 of the lead 1 is cut off to complete the product. As described above, in the semiconductor laser apparatus 21, since the terminal portions of the leads are arranged in a direction opposite to the main beam irradiation direction of the semiconductor laser device 14, the press cutting of the terminal portions are easy and the test are easily made.

Figure 7:
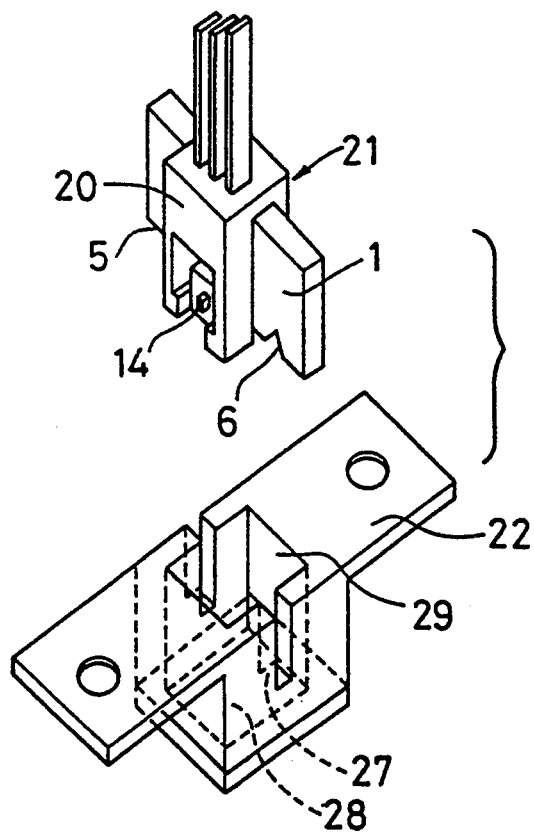
FIG. 7 is a perspective view showing the first embodiment and its supporter.

Subsequently, the attachment of the semiconductor laser apparatus 21 to the supporter 22 will be described with reference to the perspective view of FIG. 7. The semiconductor laser apparatus 21 is fixed onto the supporter 22 so that convex portions 27 formed on the supporter 22 and the concave portions 6 formed at the edge 5 of the lead 1 engage with each other. The supporter 22 is made of, for example, aluminum alloy. A diffraction grating 28 may be provided on the bottom surface of the supporter 22. By engaging the convex portions 27 with the concave portions 6 as described above, and by engaging a cavity 29 of the supporter 22 with the insulating frame 20 of the semiconductor laser apparatus 21, the position of the semiconductor laser apparatus 21 never shifts. As a result, the position relationship between the irradiated beam and the optical part is accurately held. The heat generated by the semiconductor laser device 14 passes through the lead 1 and is radiated from the supporter 22 having a large heat transfer area.

Figure 8:
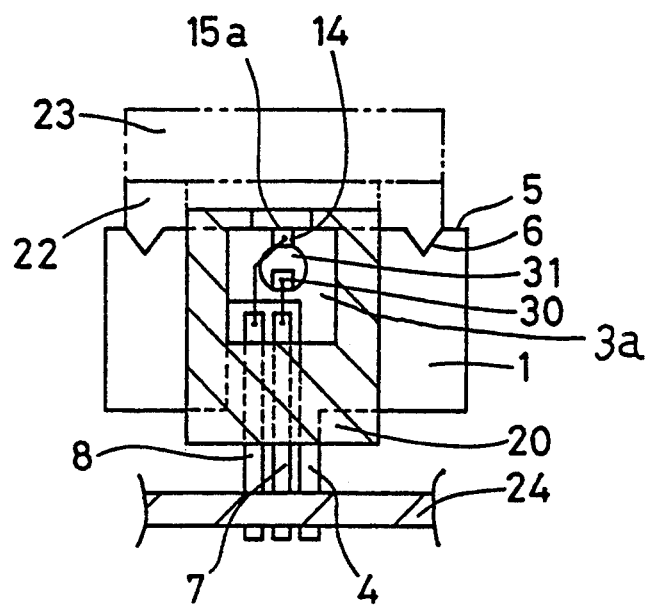
FIG. 8 is a plan cross-sectional view of a semiconductor laser apparatus according to a second embodiment of the present invention.

Subsequently, a second embodiment which is simpler than the above-described first embodiment will be described with reference to FIG. 8. FIG. 8 is a plan cross-sectional view of a semiconductor laser apparatus according to the second embodiment of the present invention. In the figure, a beam receiving device 30, which is made of a silicon crystal of PIN structure provided with an electrode on each of its obverse and reverse surfaces, is mounted on the lead 1. The semiconductor laser device 14 is mounted at a position on the lead 1 which is in front of the beam receiving device 30. Preferably, a transparent resin 31, which is made of, for example, epoxy resin or silicone resin, is formed to integrally cover from the vicinity of the rear surface (surface on the reverse side of the main irradiating surface 15a) of the semiconductor laser device 14 to the beam receiving device 30. The same parts in FIG. 8 as appear in FIGS. 3 to 5 are identified by the same reference designations.

Figure 9:
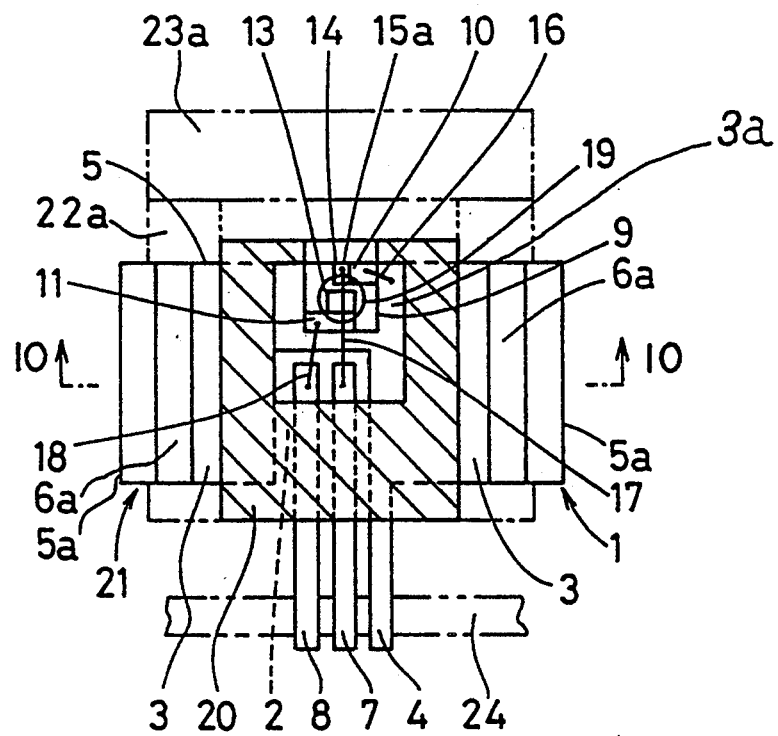
FIG. 9 is a cross-sectional view of a semiconductor laser apparatus according to a third embodiment of the present invention.
Figure 10:
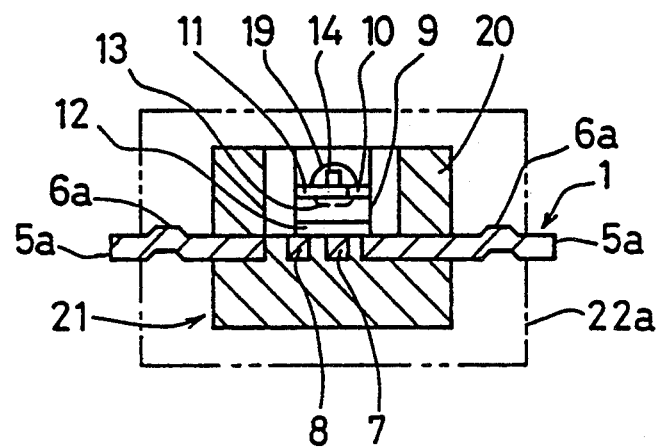
FIG. 10 is a cross-sectional view of the apparatus of FIG. 9 taken on the line C—C.

Subsequently, a third embodiment where the position shift of the semiconductor laser apparatus more hardly occurs than the above-described first and second embodiments will be described with reference to FIGS. 9 and 10. FIG. 9 is a plan cross-sectional view of a semiconductor laser apparatus according to the third embodiment of the present invention. FIG. 10 is a cross-sectional view of the apparatus of FIG. 9 taken on the line C—C. The same parts in FIGS. 9 and 10 as appear in FIGS. 3 to 5 are identified by the same reference designations. On the lead 1, convex portions 6a are formed substantially parallel to edges 5a. While, in FIG. 10, the convex portions 6a are formed so as to protrude upward, they may be formed so as to protrude downward. While, in FIG. 9, the convex portions 6a are formed along the entire longitudinal length of the lead 1, they may be partially formed along the longitudinal length of the lead 1. While, in these figures, the semiconductor laser device 14 is mounted on the beam receiving device 9, it may be mounted at a position on the lead 1 which position is in front of the beam receiving device 9.

Figure 11:
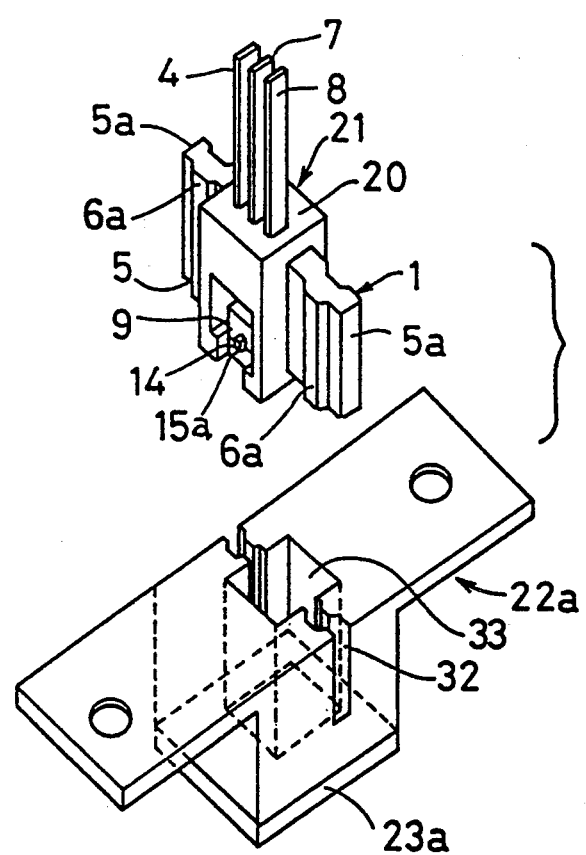
FIG. 11 is a perspective view showing a manner in which the semiconductor laser apparatus according to the third embodiment of the present invention is fixed to its supporter.

Subsequently, the attachment of the semiconductor laser apparatus 21 to a supporter 22a will be described with reference to the perspective view of FIG. 11. The supporter 22a, which is made of, for example, aluminum alloy, is provided with grooves 32 so that they engage with the convex portions 6a formed on the semiconductor laser apparatus 21, respectively. The supporter 22a is also provided with a cavity 33 of a substantially rectangular parallelepiped form so that the insulating frame 20 formed on the semiconductor laser apparatus 21 engages therewith. An optical part 23a (e.g. a diffraction grating, a half mirror, and an objective lens), which is fixed onto the bottom surface of the supporter 22a, is arranged on the side toward which the semiconductor laser device 14 irradiates a laser beam. By press-fitting the convex portions 6a of the semiconductor laser apparatus 21 into the grooves 32 of the supporter 22a, respectively, the semiconductor laser apparatus 21 can securely be fixed to the supporter 22a. Since the convex portions 6a provided for the attachment to with the supporter 22a are formed in the vicinity of the edges of the lead 1 as described above, the longitudinal length of the convex portion 6a is large compared to those of the first and second embodiments where the convex portions are formed at the edge 5. Since the portions which engage with the supporter 22a are large as a result, the position shift of the semiconductor laser apparatus 21 more hardly occurs.

As described above, in the embodiments, since the terminal portion extending in a direction opposite to the main irradiation direction of the semiconductor laser device is provided to the lead, the electrical connection between the terminal portion and the circuit board can easily be made at the terminal portion which is separate from the optical part and where parts are not densely arranged. Since the terminal portions of the leads are provided in a direction opposite to the main irradiation direction of the semiconductor laser device, the press cutting of the terminal portions and the above-described tests are easily made.

Moreover, by engaging the concave portions of the lead of the semiconductor laser apparatus with the convex portions of the supporter, and by engaging the insulating frame of the semiconductor laser apparatus with the cavity of the supporter, the position of the semiconductor laser apparatus does not shift. As a result, the position relationship between the irradiated beam and the optical part is accurately held.

Further, in the third embodiments, since the longitudinal convex portions or the longitudinal concave portions formed in the vicinity of the edges of the lead of the semiconductor laser apparatus are engaged with the longitudinal grooves of the supporter, the engaging portions are long. As a result, the position shift of the semiconductor laser more hardly occurs.

Further, since the beam is irradiated not through molding resin but directly from the cleaved surfaces of the semiconductor laser device, the beam irradiated from the flat cleaved surfaces never disperses. As a result, the irradiated beam is easily converged. Moreover, by covering the beam receiving device with the transparent resin, the beam irradiated from the rear surface of the semiconductor laser device is reflected by the interface between the transparent resin and the atmosphere and incident on the p-type diffusion region. Since the quantity of the received beam increases as a result, the sensitivity of the beam receiving device improves.

Figure 12:
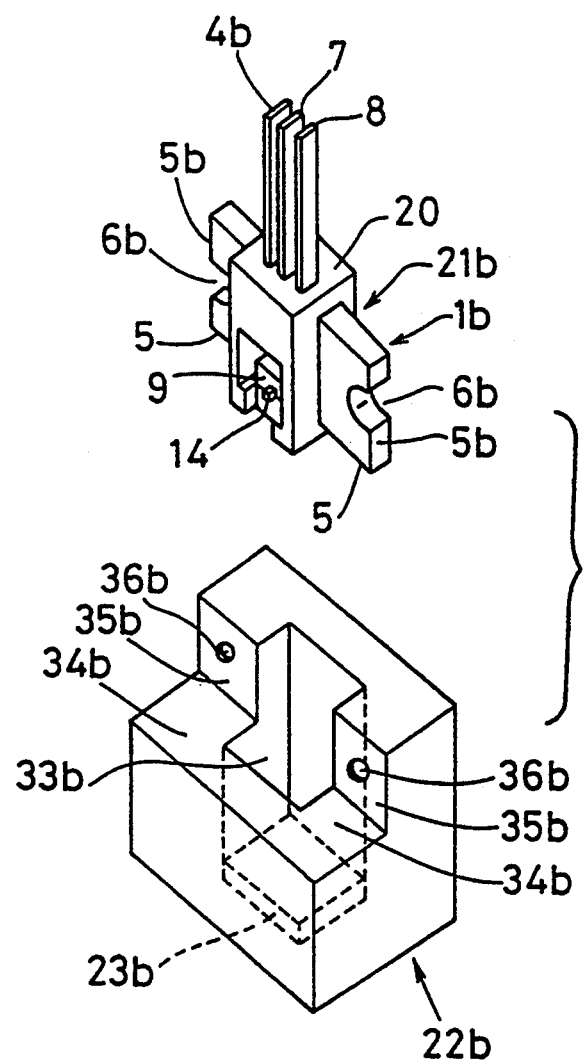
FIG. 12 is a perspective view showing another manner in which a semiconductor laser apparatus of the present invention is fixed to its supporter.

A semiconductor laser apparatus fixed to a supporter which apparatus is simpler than the apparatus shown in FIGS. 7 to 11 will be described with reference to FIG. 12. In the semiconductor laser apparatus 21b of FIG. 12, a U-shaped concave portion 6b is formed at each of side edges 5b of a lead 1b. The concave portions 6b may be V-shaped. The other parts are the same as those of the first embodiment. As described above, the positioning means is not necessarily provided in the vicinity of the edge 5 or the side edge 5b; it may be formed at the side edge 5b.

The supporter 22b, which is made of, for example, aluminum alloy, is provided with a cavity 33b into which the insulating frame 20 of the semiconductor laser apparatus 21b is to be fitted. Viewed from the side, the supporter 22b, which has a mount surface 34b which is horizontal and mount surfaces 35b which is vertical to the mount surface 34b, is step-shaped. In each of the mount surfaces 35b, a tapped hole 36b is formed. At the bottom of the cavity 33b, an optical part 23b such as a diffraction grating is fixed.

When the insulating frame 20 of the semiconductor laser apparatus 21b is fitted into the cavity 33b of the supporter 22b, the front edge 5 of the lead 1 abuts the mount surface 34b and the reverse surface of the lead 1b abuts the mount portions 35b. By driving machine screws (not shown) through the concave portions 6b into the tapped holes 36b, the semiconductor laser apparatus 21b is fixed to the supporter 22b.

By making the front edge 5 abut the mount portion 34b and driving machine screws through the concave portions 6b formed at the side edges 5b into the tapped holes 36b, the position relationship of the semiconductor laser device 14 and the optical part 23b can accurately be held.

In the above-described first to third embodiments, the first fine metallic wire 17 is substantially along the beam optical axis of the beam irradiated from the rear surface of the semiconductor laser device 14. For this reason, the sub beam from the rear surface of the semiconductor laser device 14 interferes with the fine metallic wire 17, so that the irradiated sub beam partly disperses. As a result, the quantity of the beam received by the p-type diffusion region 13 varies. Further, since the first fine metallic wire 17 is along the beam optical axis, it is an obstruction at the time of the molding of the transparent resin 19. Since the configuration of the transparent resin 19 differs among each product for this reason, the quantity of the beam received by the p-type diffusion region 13 also differs among each product.

Figure 13:
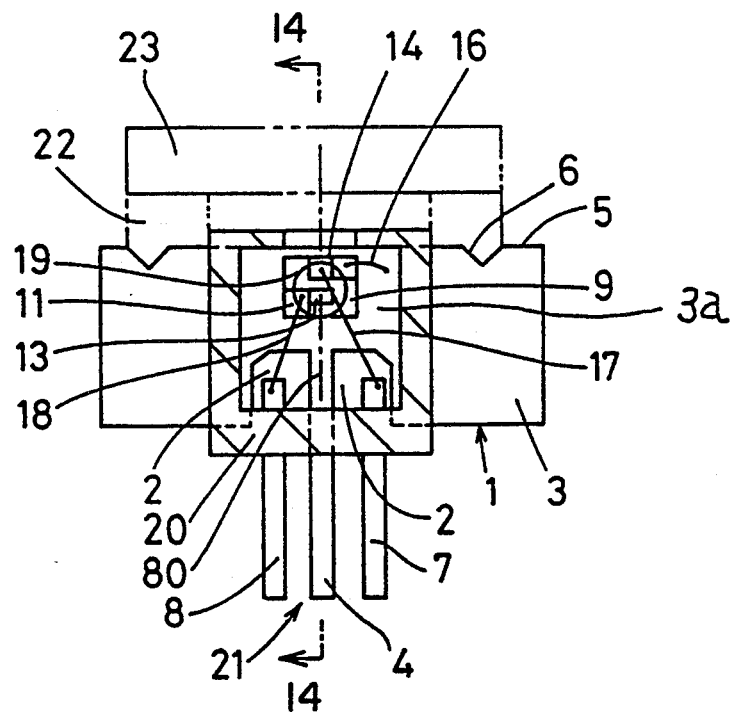
FIG. 13 is a plan cross-sectional view of a semiconductor laser apparatus according to a fourth embodiment of the present invention.
Figure 14:
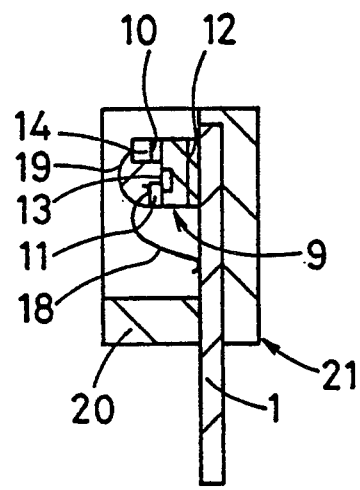
FIG. 14 is a cross-sectional view of the apparatus of FIG. 12 taken on the line A—A.

On the other hand, in a fourth embodiment shown in FIGS. 13 and 14, the terminal portion 4 of the first lead 1 extends from a substantial center to the rear of the lead, and a recess 2 is provided on either side at the root of the terminal portion 4. The second and third leads 7 and 8 are arranged to extend from the insides of the right and left recesses 2, respectively, toward the rear. With this arrangement, the first and second fine metallic wires 17 and 18 are to be allotted to the left and right sides, respectively, of a center line 80 of the beam optical axis of the semiconductor laser device 14. In the fourth embodiment, the arrangement of the other parts is substantially the same as that of the first embodiment, and the same parts in the fourth embodiment as appear in the first embodiment are therefore identified by the same reference designations and description thereof will be omitted.

As described above, in the fourth embodiment, the first fine metallic wire 17 for connecting the semiconductor laser device 14 and the second lead 7 is provided on the right (or the left) side of the center line 80 of the beam optical axis of the semiconductor laser device 14. With this arrangement, since the sub beam irradiated from the rear surface of the semiconductor laser device 14 does not interfere with the first fine metallic wire 17, a sufficient quantity of beam is incident on the beam receiving device 9. Moreover, since the first and second fine metallic wires 17 and 18 are allotted to the left and right sides, they are not obstructive at the time of the molding of the transparent resin 19 which is to be formed between the wires 17 and 18. Since the transparent resin 19 of a regular configuration can be obtained for this reason, the variation of the quantity of the beam received by the beam receiving device 9 decreases. Since a monitoring current with little variation in quantity can sufficiently be obtained from the beam receiving device 9 as a result, the output of the semiconductor laser device 14 can accurately be controlled.

In the first to fourth embodiments, since the semiconductor laser device 14 is mounted on the beam receiving device 9, the temperature of the beam receiving device 9 increase as the temperature of the semiconductor laser device 14 increases with the time of use. Consequently, the beam receiving characteristic of the beam receiving device 9, that is, the quantity of the monitoring current for the quantity of a beam received by the beam receiving device 9 varies with temperature. For this reason, it is difficult to obtain a stable monitoring current. In a fifth embodiment shown in FIGS. 15 and 16 and a sixth embodiment shown in FIG. 17, such a problem has been solved.

Figure 15:
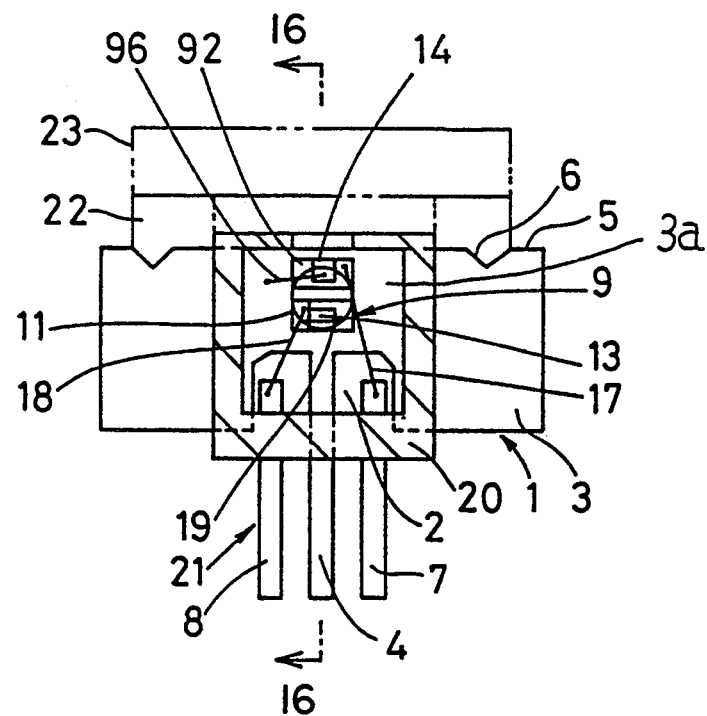
FIG. 15 is a plan cross-sectional view of a semiconductor laser apparatus according to a fifth embodiment of the present invention.
Figure 16:
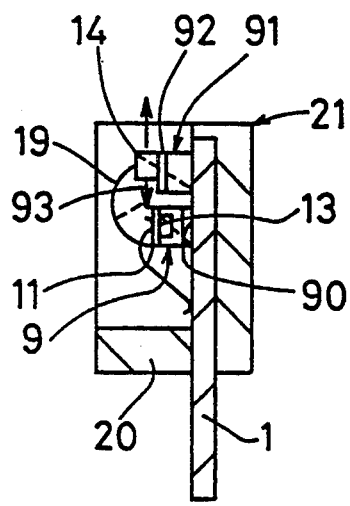
FIG. 16 is a cross-sectional view of the apparatus of FIG. 14 taken on the line A—A.

The fifth embodiment of the present invention will be described with reference to FIGS. 15 and 16. FIG. 15 is a plan cross-sectional view of a semiconductor laser apparatus according to the fifth embodiment of the present invention. FIG. 16 is a cross-sectional view of the apparatus of FIG. 15 taken on the line A—A. In these figures, the beam receiving device 9 is made of, for example, a silicon crystal of PIN structure on which the surface electrode 11 and a reverse surface electrode 90 are provided. The surface electrode 11 is formed to be in ohmic contact with a beam receiving surface 13 constituted by a p-type diffusion region. The beam receiving device 9 is fixed onto the lead 1 through a conductive adhesive agent such as silver paste. The beam receiving surface 13 is formed to be substantially parallel to the lead 1.

The semiconductor laser device 14 is fixed by alloying it with a surface electrode 92 of a submount 91 so that the main beam irradiating surface is situated at the front. The semiconductor laser device 14 is formed so that the reflectance of the rear surface is higher than that of the front surface in order that sub beam irradiation for monitoring is made from the rear surface. As described above, the semiconductor laser device 14 is mounted through the submount 91 at a position on the lead 1 which position is in front of the beam receiving device 9.

The submount 91, which is made of, for example, silicon, is provided with the surface electrode 92 and a reverse surface electrode (not shown), and is fixed onto the lead 1 through silver paste.

A fine metallic wire 96 made of gold is arranged to connect the semiconductor laser 14 and the lead 1. The fine metallic wires 17 and 18, which are made of gold, are arranged to connect the surface electrode 92 of the submount 91 and the second lead 7, and the surface electrode 11 of the beam receiving device 9 and the third lead 8, respectively.

A center line 93 of the beam optical axis, which is a line connecting the irradiation points of the front and rear surfaces of the semiconductor laser device 14, means a center line along the direction in which the irradiated beam advances. The semiconductor laser device 14 is arranged so that the center line 93 is situated at a position higher than the beam receiving surface of the beam receiving device 9.

The transparent resin 19, which is made of, for example, epoxy resin, is formed to integrally cover from the vicinity of the rear surface of the semiconductor laser device 14 to the beam receiving surface 13. In order to drive the semiconductor laser apparatus of the fifth embodiment, a positive voltage is applied to the lead 8, a ground voltage is applied to the terminal portion 4 of the lead 1, and a negative voltage is applied to the lead 7. Another driving method will be described. The submount 91 made of a material having an excellent conductivity such as copper is mounted on the lead 1. The semiconductor laser device 14 is mounted on the submount 91. The fine metallic wire 96 is unnecessary in this case. Instead, the semiconductor laser device 14 and the lead 7 are connected by the fine metallic wire 17. Since the submount 91 is conductive, it is possible to connect the rear surface of the semiconductor laser device 14 to a ground voltage. As a result, a positive voltage, the ground voltage and a positive voltage can be applied to the lead 8, the terminal portion 4 and the lead 7, respectively. By using a submount made of an insulating material or a conductive material as the submount 91, the polarity (polarity of the voltage to be applied to each terminal portion) of the apparatus can easily be changed. The same parts in FIGS. 15 and 16 as appear in FIGS. 3 and 4 are identified by the same reference designations.

Figure 17:
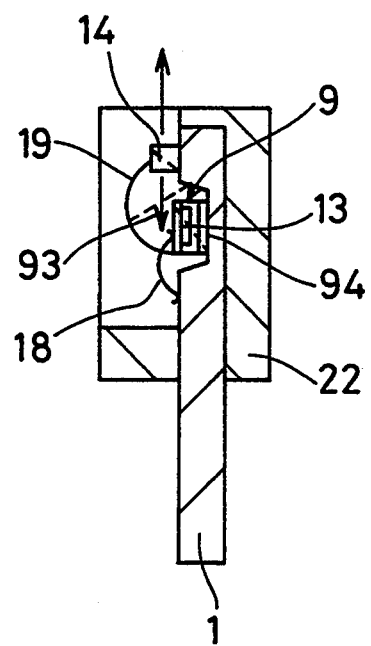
FIG. 17 is a side cross-sectional view of a semiconductor laser apparatus according to a sixth embodiment of the present invention.

Subsequently, a sixth embodiment of the present invention having a heat radiation performance more excellent than that of the above-described fifth embodiment will be described with reference to FIG. 17. FIG. 17 is a side cross-sectional view of a semiconductor laser apparatus according to the sixth embodiment of the present invention. In the figure, on the lead 1, a concave portion 94 is partially formed by etching. The beam receiving device 9 is mounted in the concave portion 94. The semiconductor laser device 14 is mounted at a position on the lead 1 which position in front of the beam receiving device 9. The same parts in FIG. 17 as appear in FIGS. 15 and 16 are identified by the same reference designations. In the sixth embodiment, since the beam receiving device 9 is mounted in the concave portion 94 of the lead 1, the center line of the beam optical axis of the semiconductor laser device 14 is arranged at a position higher than the position of the beam receiving surface (the surface of the P-type diffusion region 13). As a result, a sufficient quantity of sub beam irradiated from the rear surface of the semiconductor laser device 14 is incident on the beam receiving surface. Moreover, since the semiconductor laser 14 is mounted not through the submount but directly on the lead 1, its heat radiation performance improves. Since the temperature rise of the semiconductor laser device 14 is restrained, the life thereof is prolonged. While, in the above description, the concave portion 94 of the lead 1 is formed by etching, a crank-form portion may be formed by pressing. What is necessary is to arrange the center line 93 at a position higher than the position of the beam receiving surface and, in order to do that, to lower the surface on which the beam receiving device 9 is mounted.

As described above, in the fifth and sixth embodiments, since the semiconductor laser device and the beam receiving device are arranged on the lead separately from each other, the temperature of the beam receiving device does not increase so much with the increase in the temperature of the semiconductor laser device. Since the beam receiving characteristic (monitoring current value for the quantity of a received beam) of the light receiving device becomes stable as a result, the monitoring current also becomes stable. Further, by arranging the center line of the beam optical axis of the semiconductor laser device at a position higher than the position of the beam receiving surface of the beam receiving device, a sufficient quantity of sub beam irradiated from the rear surface of the semiconductor laser device is incident on the beam receiving surface. As a result, a sufficient quantity of monitoring currents can be secured.

As previously mentioned, by using a submount made of an insulating material or a conductive material as the submount 91 provided between the lead 1 and the semiconductor laser device 14, the polarity of the apparatus can easily be changed. Moreover, by placing the semiconductor laser device 14 not through the submount 91 but directly on the lead 1, the heat radiation performance of the semiconductor laser device 14 can be improved, so that the life of the device is prolonged.

Figure 18:
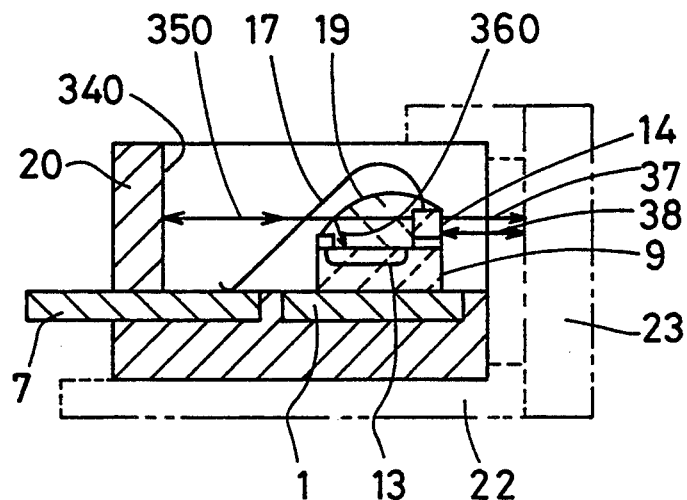
FIG. 18 shows an apparatus approximately the same as the first embodiment of FIG. 4 under a condition where it has been rotated by 90°.

FIG. 18 is a cross-sectional view substantially the same as the cross-sectional view of the previously-described first embodiment of FIG. 4. The thickness of the insulating frame 20, however, is different. Moreover, the dimension in the lateral direction is slightly different. With reference to FIG. 18, defects of the first embodiment will be described. Other embodiments of the present invention where the defects have been removed will also be described.

Figure 19:
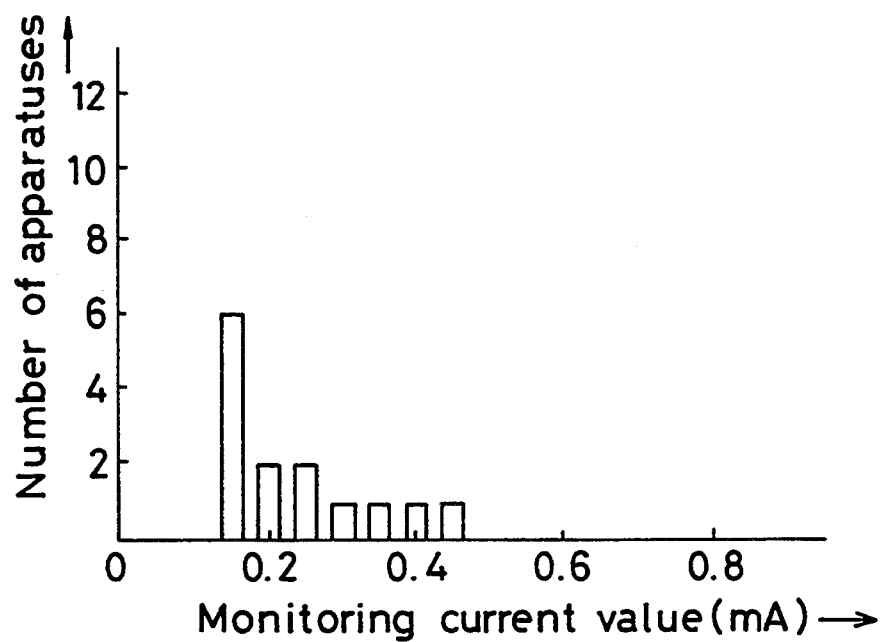
FIG. 19 graphically shows a monitoring current distribution of the first embodiment obtained by using fourteen semiconductor laser apparatuses.

The first defect of the first embodiment is that the quantity of the beam received by the p-type diffusion region 13 varies. The inventors of the present invention have found that this is because an internal wall 340 of the insulating frame 20 is formed vertically to the second lead 7. Specifically, a part of the sub beam irradiated from the rear surface of the semiconductor laser device 14 penetrates through the transparent resin 19, and is substantially horizontally reflected by the internal wall 340 of the insulating frame 20; a part of the reflected beam 350 again enter the transparent resin 19 and enter the p-type diffusion region 13. Since, however, the quantity of the reflected beam 350 entering the transparent resin 19 varies according to the resin configuration of the transparent resin 19, the quantity of the beam received by the p-type diffusion region 13 varies. Another reason therefor is that a part of the sub beam irradiated from the rear surface of the semiconductor laser device 14 is reflected by the surface of the transparent resin 19 and the reflected beam enter the p-type diffusion region 13, and since the quantity of the reflected beam is not constant because of unevenness of the surface of the transparent resin 19, the quantity of the received beam varies. FIG. 19 shows a distribution of the monitoring currents by the sub beam irradiated from the rear surface of the semiconductor laser apparatus of the above-described arrangement, obtained by using fourteen semiconductor laser apparatuses which are operated with an optical output of 3 mW. From the figure, it is understood that the current values largely varies.

Further, since the irradiated beam has a width although they are of a beam form, some components thereof deviate from the horizontal line, and accordingly, some components of the reflected beam 350 also deviate from the horizontal line. The second defect of the first embodiment is that such a beam enters the optical part 23 to obscure the beam irradiated from the front surface of the semiconductor laser device 14.

Figure 20:
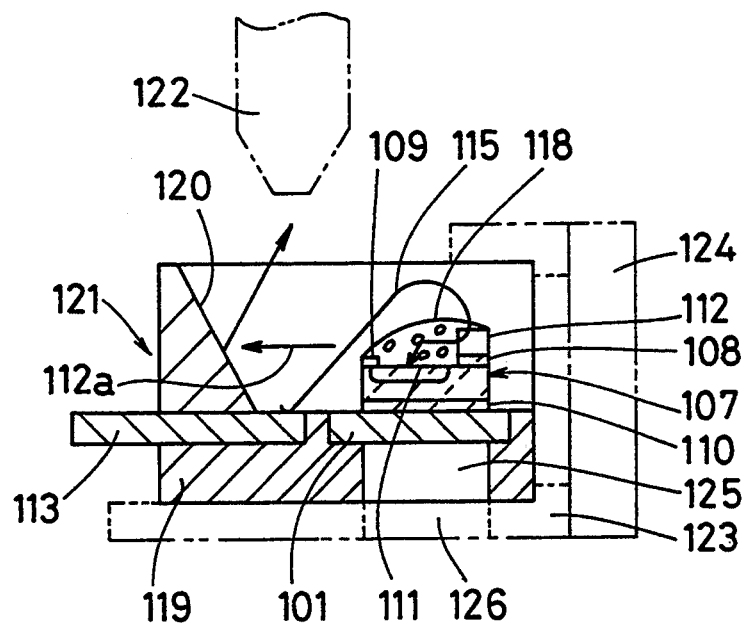
FIG. 20 is a side cross-sectional view of a semiconductor laser apparatus according to a seventh embodiment of the present invention.
Figure 21:
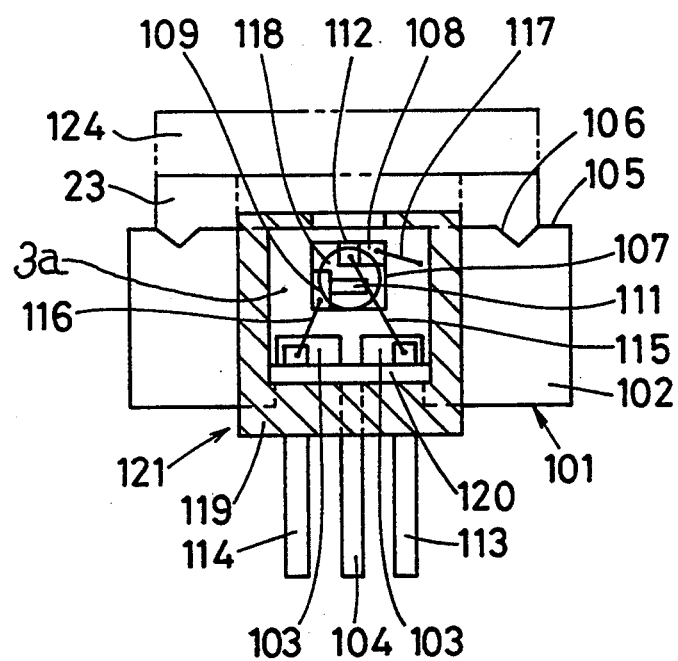
FIG. 21 is a plan cross-sectional view of semiconductor laser apparatus according to the seventh embodiment.

Subsequently, seventh, eighth and ninth embodiments where such defects have been removed will be described. FIG. 20 is a cross-sectional side view of a semiconductor laser apparatus according to the seventh embodiment of the present invention. FIG. 21 is a plan cross-sectional view of the semiconductor laser apparatus. In these figures, a lead 101, which is made of a metallic material, such as copper, with a thickness of 0.2 to 1.0 mm, includes recesses 103, a rectangular portion 102 and a terminal portion 104. The lead 101 is provided with positioning portions 106 which are V-shaped grooves at its edge 105. The positioning portions 106 may be holes whose cross sections are U-shaped, or may be a V-shaped or a U-shaped convex or a projection whose cross section is U-shaped.

A beam receiving device 107 is made of, for example, a silicon crystal of PIN structure on which surface electrodes 108 and 109 and a reverse surface electrode 110 are provided. The surface electrode 109 is formed to be in ohmic contact with a beam receiving surface 111 constituted by a p-type diffusion region. The beam receiving device 107 is fixed onto the lead 101 through a conductive adhesive agent such as silver paste.

A semiconductor laser device 112 is made of, for example, a GaAlAs beam emitting layer including a linear active layer and clad layers sandwiching the active layer. On each side portion, which is cleaved, a reflective film is formed. The semiconductor laser device 112 is fixed through silver paste or solder onto the surface electrode 108 of the beam receiving device 107 so that its main beam irradiating surface is situated at the front. The semiconductor laser device 112 is formed so that the reflectance of the rear surface is higher than that of the front surface in order that sub beam irradiation for monitoring is made from the rear surface. The reflectance of the rear surface may be lower than that of the front surface according to the purpose. As described above, an irradiated sub beam 112a of the center of the beam optical axis of the semiconductor laser device 112 is situated at a position higher than the position of the beam receiving surface 111 of the beam receiving device 107.

The other leads 113 and 114, which are made of a metallic material such as copper, are situated in the recesses of the lead 101 and extend in a direction opposite to the main irradiation direction of the front surface of the semiconductor laser device 112. Fine metallic wires 115 and 116, both of which are made of gold, are arranged to connect the semiconductor laser device 112 and the lead 113, and the surface electrode 109 of the beam receiving device 107 and the lead 114, respectively. The other fine metallic wire 117 is arranged to connect the surface electrode 108 of the beam receiving device 107 and the lead 101.

A molding resin 118, which is made of, for example, epoxy resin, is formed to integrally cover from the vicinity of the rear surface of the semiconductor laser device 112 to the beam receiving surface 111 of the beam receiving device 107. Preferably, the molding resin 118 is a transparent resin in which a dispersing agent such as silicon oxide ($SiO_2$) or aluminum oxide ($Al_2O_3$) is mixed at a rate of 0.2 to 50 percent by weight. As the transparent resin, epoxy resin, silicon resin or acrylic resin is used. As the molding resin 118, ultraviolet hardened resin in which the above-mentioned dispersing agent is mixed may be used. As the ultraviolet hardened resin, epoxy resin, silicon resin or acrylic resin is used. Although the configuration of the transparent resin containing the dispersing agent sometimes changes while being moved to a heater after potting, the configuration of the ultraviolet hardened resin containing the dispersing agent does not change since it can be hardened at the place where the potting is performed. Although the transparent resin itself is transparent, it becomes nearly translucent when the dispersing agent is mixed thereto. Moreover, at need, a transparent resin not containing the dispersing agent or an ultraviolet hardened resin not containing the dispersing agent may be used as the molding resin 118.

An insulating frame 119, which is made of, for example, polycarbonate resin or epoxy resin, is formed by transfer molding to be U-shaped so that the main beam irradiating surface of the semiconductor laser device 112 is exposed, and to nip the obverse and reverse surfaces of each of the leads 101, 113 and 114. The insulating frame 119 is provided with an outwardly inclining internal wall 120 in the rear of the beam receiving device 107, that is, on the rear irradiation side of the semiconductor laser device 112. Specifically, the inclination of the internal wall 120 is such that the angle of the internal wall 120 to the lead 101 is an obtuse angle and that the space within the insulating frame 119 upwardly widens. The above-described parts constitute a semiconductor laser apparatus 121.

Normally, the connection of the fine metallic wire 115 to the lead 113 is made by wire bonding by means of a capillary 112 of a wire bonder. In this embodiment, since the internal wall 122 of the insulating frame outwardly inclines, bonding can be performed with the internal wall 120 not being in contact with an inclining portion of the capillary 112 but being in the vicinity thereof. Since the space into which the capillary is to be inserted can be smaller than in conventional apparatuses for this reason, the size of the semiconductor laser apparatus 121 can be reduced.

The semiconductor laser apparatus 121 is fixed to a supporter 123 so that convexes or concaves formed on the supporter 123 engage with the positioning portion 106 of the lead 101, that is, the concaves or convexes formed at the edge 105 of the lead 101. An optical part 124 (e.g. a diffraction grating, a half mirror, and an objective lens) is provided in front of the semiconductor laser device 112, that is, on the side toward which the semiconductor laser device 112 irradiates a main laser beam. Further preferably, in the semiconductor laser apparatus 121, holes 125 and 126 are provided to the insulating frame 119 and to the supporter 123, respectively, substantially just below the beam receiving device 107. The holes 125 and 126 facilitate the heat radiation from the beam receiving device 107.

In the apparatus of FIG. 18, since the sub beam irradiated from the rear surface is reflected by the surface of the transparent resin which is difficult to control and the reflected beam is incident on the beam receiving surface, it is difficult to control the monitoring beam quantity. On the contrary, in this embodiment, since the dispersing agent is mixed in the molding resin 118, the sub irradiated beam from the rear surface of the semiconductor laser device 112 is reflected by the dispersing agent to enter the beam receiving surface 111. Since the kind, particle diameter and mixing amount of the dispersing agent is easily controlled, the monitoring beam quantity is easily controlled.

Figure 22:
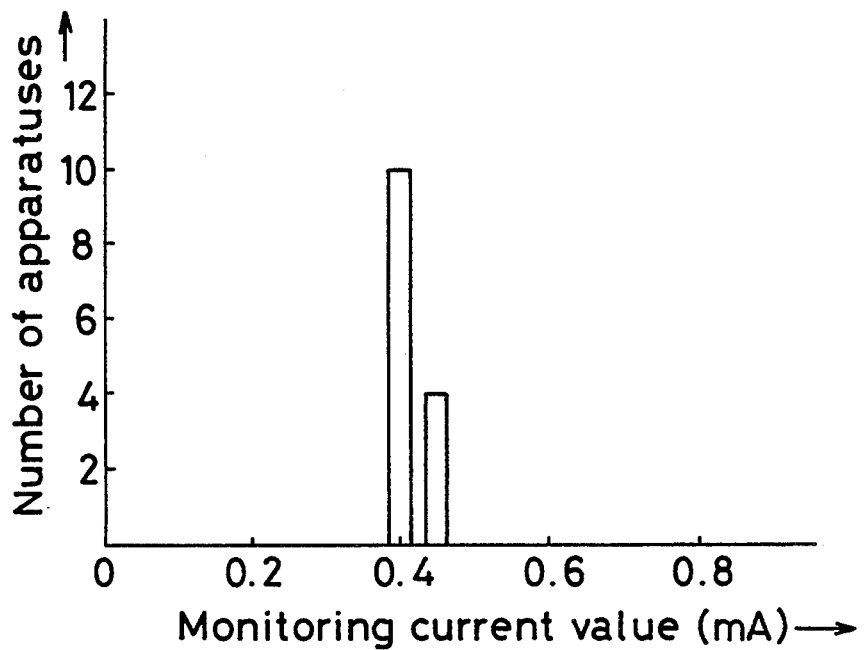
FIG. 22 graphically shows a monitoring current distribution of the seventh embodiment obtained by using fourteen semiconductor laser apparatuses.

Subsequently, the monitoring current value of the semiconductor laser apparatus of the seventh embodiment will be described with reference to FIG. 22. The monitoring current value obtained when fourteen semiconductor laser apparatuses are operated with an output of 3 mW was measured. In this figure, the axis of abscissas represents the monitoring current value (mA) and the axis of ordinates represents the number of apparatuses. From this figure, it is understood that the variation of the monitoring current value is small compared to that of the first embodiment shown in FIG. 19.

Figure 23:
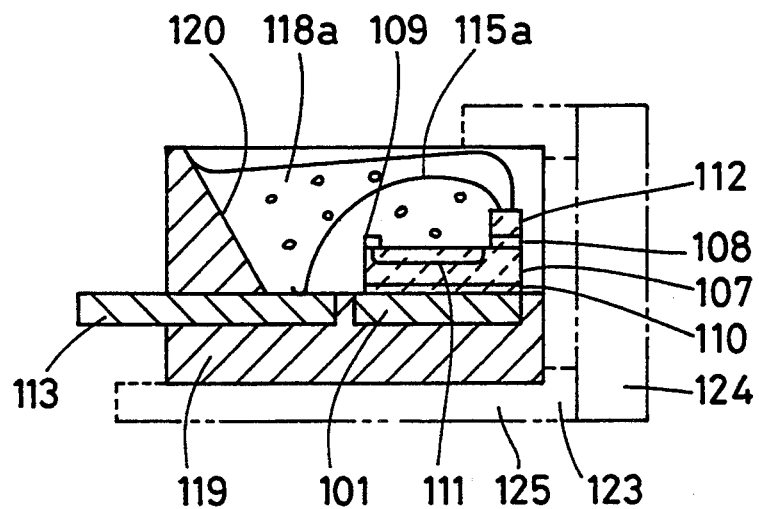
FIG. 23 is a side cross-sectional view of a semiconductor laser apparatus according to an eighth embodiment of the present invention.

In the eighth embodiment shown in FIG. 23, a molding resin 118a is formed to substantially cover the concave portion of the insulating frame 119 together with a fine metallic wire 115a. With this arrangement, the fine metallic wire 115a is electrically protected and is not damaged during the manufacture or the tests.

Figure 24:
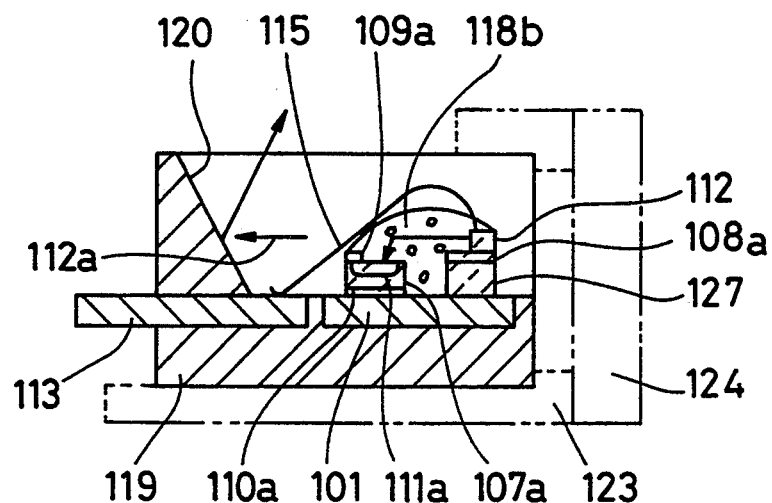
FIG. 24 is a side cross-sectional view of a semiconductor laser apparatus according to a ninth embodiment of the present invention.

Subsequently, the ninth embodiment where the temperature rise of the beam receiving device is smaller than that of the seventh embodiment will be described with reference to the cross-sectional view of FIG. 24. A beam receiving device 107a is made of, for example, a silicon crystal of PIN structure provided with a surface electrode 109a and a reverse surface electrode 110a. The surface electrode 109a is formed to be in ohmic contact with a beam receiving surface 111a constituted by a p-type diffusion region. The beam receiving device 107a is fixed onto the lead 101 through a conductive adhesive agent.

A submount 127, which is made of, for example, silicon, is provided with a surface electrode 108a and a reverse surface electrode (not shown), and is fixed onto the lead 101 through the conductive adhesive agent. The semiconductor laser device 112 is fixed by alloying it with the surface electrode 108a of the submount 127. As described above, the semiconductor laser device 112 is mounted through the submount 120 at a position on the lead 101 which position is in front of the beam receiving device 107a, and the sub irradiated beam 112a from the center of the beam optical axis of the semiconductor laser device 112 is situated at a position higher than the position of the beam receiving surface 111a. The main beam irradiating surface of the semiconductor laser device 112 is provided at the front.

A molding resin 118b is also formed to cover from the vicinity of the rear surface of the semiconductor laser device 112 to the beam receiving surface 111a. The same parts in FIG. 24 as appear in FIGS. 20 and 21 are identified by the same reference designations. Since the semiconductor laser device 112 and the beam receiving device 107a are arranged on the lead 101 separately from each other as described above, the temperature of the beam receiving device 107a does not increase so much with the increase in the temperature of the semiconductor laser device 112. Since the beam receiving characteristic (monitoring current value for the quantity of a received beam) of the beam receiving device 107a becomes stable as a result, the monitoring current also becomes stable. Moreover, similarly to the seventh embodiment, holes may be provided to the insulating 110 and the supporter 123 substantially just below the submount 127 and the beam receiving device 107a.

Instead of the arrangement of this embodiment, the following arrangement may be used: a concave portion is formed on the lead and the beam receiving device is mounted in the concave portion; and the semiconductor laser device is mounted directly at a position on the lead which position is in front of the beam receiving device so that the beam optical axis is situated at a position higher than the position of the beam receiving surface.

As described above, in the seventh to ninth embodiments, since the center line of the beam optical axis is provided at a position higher than the position of the beam receiving surface and the transparent resin is formed to cover from the rear surface of the semiconductor laser device to the beam receiving surface, a sufficient quantity of beam is received by the beam receiving surface. Since the outwardly inclining internal wall of the insulating frame is provided in the rear of the beam receiving device, a part of the sub irradiated beam from the rear surface of the semiconductor laser device passes through the transparent resin and is substantially horizontally incident on the internal wall to be reflected by the inclining internal wall. The reflected beam obliquely advances in the upper direction. Since the reflected beam does not enter the beam receiving surface and the optical part, the quantity of the beam received by the beam receiving surface does not vary but becomes stable. Since a stable monitoring current is obtained from the beam receiving device as a result, the output of the semiconductor laser device can accurately be controlled. Moreover, since the reflected beam does not enter the optical part but only the irradiated beam enters the optical part, a predetermined irradiated main beam can accurately be supplied to the optical part.

Moreover, since the internal wall of the insulating frame outwardly inclines, bonding can be performed with the internal wall not being in contact with an inclining portion of the capillary but being in the vicinity thereof. Since the space into which the capillary is to be inserted can be smaller than in conventional apparatuses for this reason, the size of the semiconductor laser apparatus can be reduced. Further, by engaging the positioning portion provided to the lead of the semiconductor laser apparatus with the convex or concave portions of the supporter, the position shift of the semiconductor laser apparatus can be prevented, so that the position relationship between the irradiated main beam and the optical part can accurately be held.

Further, by mixing the dispersing agent in the molding resin, the irradiated sub beam from the rear surface of the semiconductor laser device is reflected by the dispersing agent and incident on the beam receiving surface. Since the kind, particle diameter and mixing amount of the dispersing agent is easily controlled, the quantity of the monitoring beam is easily controlled. For this reason, the variation of the quantity of the received beam is small.

In the semiconductor laser apparatus of FIG. 18, after a irradiated main beam 37 enters the optical part 23 such as a diffraction grating, a part thereof is reflected by the optical part 23. The reflected beam (returned beam 38) returns to the semiconductor laser device 14. The returned beam 38 is reflected by the surface of the semiconductor laser device 14 and enters the optical part 23 again. Since this beam obstructs the irradiated main beam 37, noise is generated.

Figure 25:
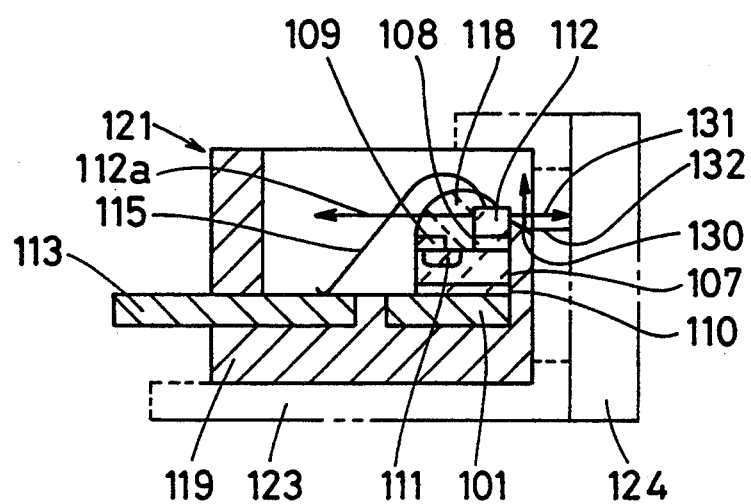
FIG. 25 is a side cross-sectional view of a semiconductor laser apparatus according to a tenth embodiment of the present invention.
Figure 26:
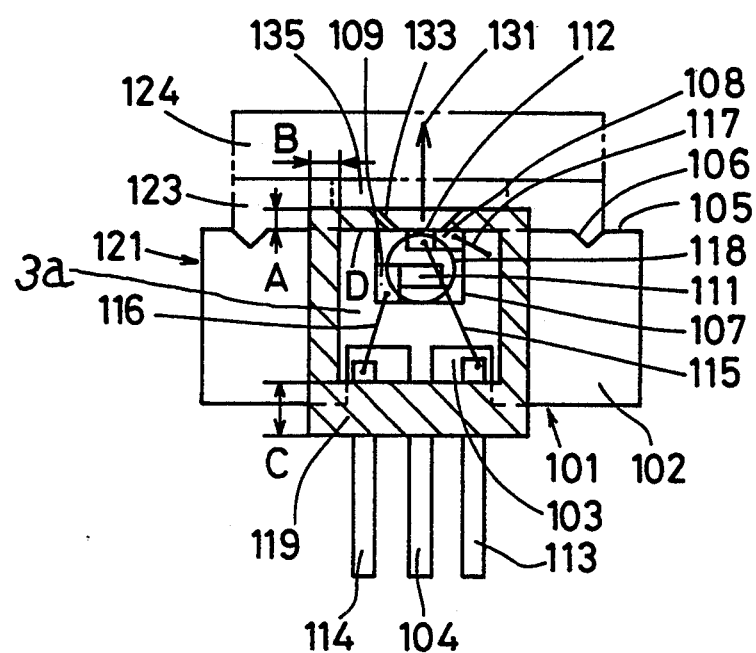
FIG. 26 is a plan cross-sectional view of semiconductor laser apparatus according to the tenth embodiment.
Figure 27:
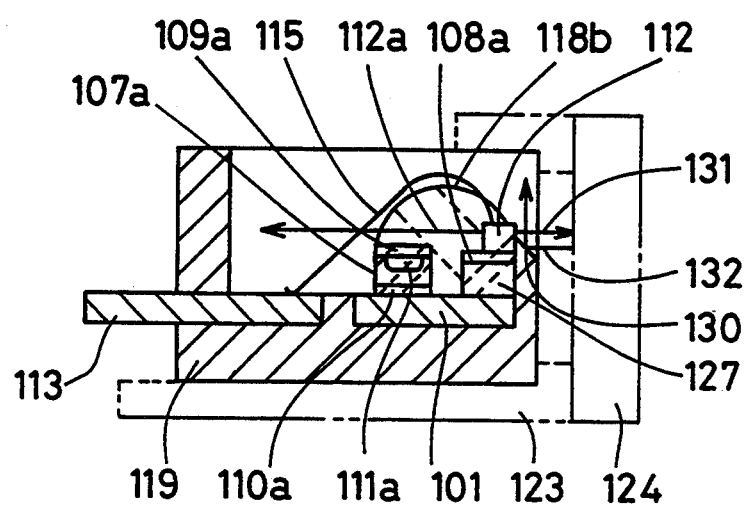
FIG. 27 is a side cross-sectional view of a semiconductor laser apparatus according to an eleventh embodiment of the present invention.

A tenth embodiment shown in FIGS. 25 and 26 and an eleventh embodiment shown in FIG. 27 are improved to prevent the generation of noise. In FIGS. 25 and 26, the same parts as appear in FIG. 21 are identified by the same reference designations. In FIGS. 25 and 26, the insulating frame 119, which is made of, for example, polycarbonate resin or epoxy resin, is formed by transfer molding to be U-shaped so that the vicinity of a portion of the semiconductor laser device 112 from which a irradiated main beam 131 is irradiated is exposed, and to nip the obverse and reverse surfaces of each of the leads 101, 113 and 114. The insulating frame 119 is provided with a downhill external wall 130 at the front below the irradiated main beam 131 from the semiconductor laser device 112. An opening 133 of the insulating frame 119 situated in front of the semiconductor laser device 112 has a surface which inclines so that the opening frontwardly widens. In order to protect the semiconductor laser device 112, the opening 133 is preferably small. Since the irradiated main beam 131 is irradiated in a cone shape, it is required that the cone-shaped beam is not interrupted by the opening 133. In order for the opening 133 to fulfill these two conditions, the opening 133 is formed to have the above-described inclining surface.

A front thickness A of the insulating frame 119 is formed to be comparatively thin, for example, 0.3 mm. This is in order to arrange the semiconductor laser device 112 and the optical part 124 as close to each other as possible so that the main beam irradiated from the semiconductor laser device 112 is not interrupted by the opening 133. A side thickness B of the insulating frame 119 is formed to be comparatively thin, for example, 0.6 mm. This is in order to decrease the external size of the semiconductor laser apparatus. A rear thickness C of the insulating frame 119 is formed to be comparatively thick, for example, 1.5 mm. This is in order to integrally support the leads 101, 113 and 114 to secure a required strength. By forming a protruding portion D of the insulating frame 119 in front of the beam receiving device 107, it is prevented that the beam receiving device 107 and the semiconductor laser device 112 are damaged at the time of attachment or packing. The above-described parts constitute the semiconductor laser apparatus 121.

In the semiconductor laser apparatus 121, after the main irradiated main beam 131 enters the optical part 124 such as a diffraction grating, a part thereof is reflected by the optical part 124 and the reflected beam (returned beam 132) returns to the semiconductor laser device 112. The returned beam 132 is reflected by the forwardly inclining downhill external wall 130 provided below the irradiated main beam 131, and advances upward. As described above, the returned beam 132 does not enter the optical part 124 again.

Subsequently, the eleventh embodiment where the temperature rise of the beam receiving device is smaller than that of the tenth embodiment will be described with reference to the cross-sectional view of FIG. 27. In the figure, the same parts as appear in FIG. 24 are identified by the same reference designations. In the eleventh embodiment, similarly to the ninth embodiment of FIG. 24, since the semiconductor laser device 112 and the beam receiving device 107a are mounted on the lead 101 separately from each other, the temperature of the beam receiving device 107a does not increase so much with the increase in the temperature of the semiconductor laser device 112. In addition to the advantage that the monitoring current becomes stable since the beam receiving characteristic (monitoring current value for the quantity of a received beam) of the beam receiving device 107a becomes stable, since the insulating frame 119 is provided with the downhill external wall 130 at the front below the main irradiated beam 131 from the semiconductor laser device 112 similarly to the seventh embodiment, the irradiated main beam which is reflected by the optical part 124 (i.e. returned beam 132) advances upward along the downhill external wall and does not enter the optical part again. As a result, the generation of noise due to the returned beam 132 is prevented.

As described above, in the tenth and eleventh embodiments, since the downhill external wall 130 is provided to the insulating frame 119, the returned beam 132 (irradiated main beam reflected by the optical part 124) advances not toward the optical part 124 but upward. As a result, no noise is generated. Furthermore, since the opening of the insulating frame situated in front of the semiconductor laser device is formed to frontwardly widens, it is prevented that the cone-shaped main irradiated beam is interrupted by the opening. Moreover, since the opening is small, the semiconductor laser device is protected.

Figure 28:
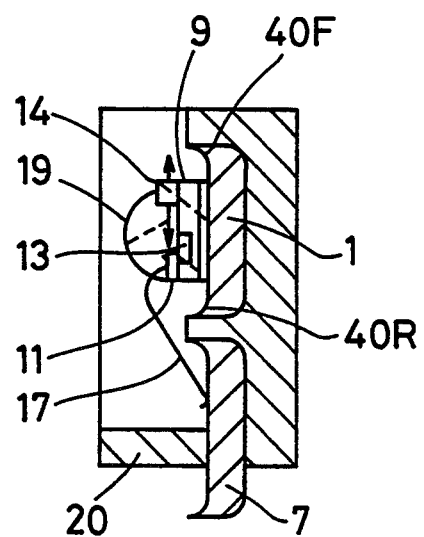
FIG. 28 is a side cross-sectional view of a semiconductor laser apparatus where a beam receiving device and a semiconductor laser device are placed on a surface where burrs of a lead are present.

In was found through a research by the inventors of the present invention that in the above-described embodiments, when the leads on which the beam receiving device and the semiconductor laser device are mounted are formed by punching a metal plate, if the surface on which the beam receiving device and the semiconductor laser device are to be mounted is selected at random, the quantity of the beam received by the p-type diffusion layer of the beam receiving device varies. FIG. 28 is a view for explaining a cause of this phenomenon. The apparatus of FIG. 28 corresponds to that of FIG. 4, and the same parts therein as appear in FIG. 4 are therefore identified by the same reference designations. In FIG. 28, since the beam receiving device 9 is mounted on a surface of the lead 1 where punching burrs 40F and 40R exist, the main irradiated beam of the semiconductor laser device 14 is interfered with by a front burr 40F, so that a part of the dispersed beam enters the p-type diffusion region 13. As a result, the quantity of the beam incident on the p-type diffusion region 13 varies.

Figure 29:
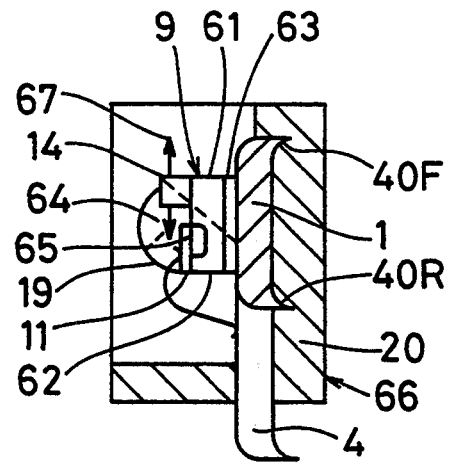
FIG. 29 is a side cross-sectional view of a semiconductor laser apparatus according to a twelfth embodiment of the present invention.
Figure 30:
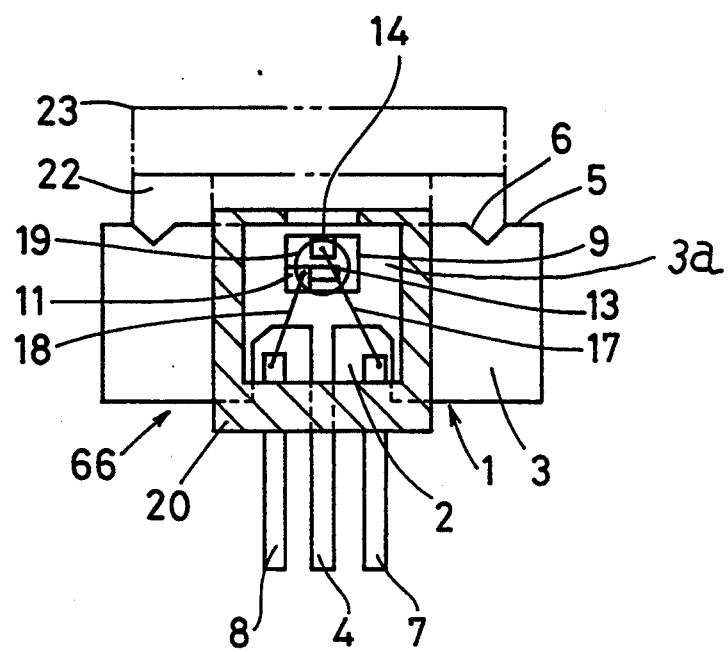
FIG. 30 is a plan cross-sectional view of the semiconductor laser apparatus according to the twelfth embodiment.
Figure 31:
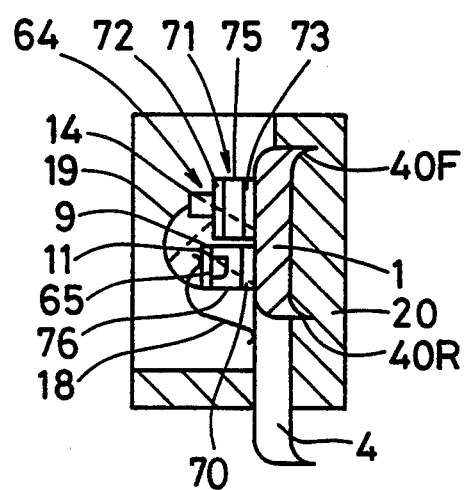
FIG. 31 is a side cross-sectional view of a semiconductor laser apparatus according to a thirteenth embodiment of the present invention.

In a twelfth embodiment shown in FIGS. 29 and 30 and a thirteenth embodiment shown in FIG. 31, such a defect has been removed. FIG. 29 is a side cross-sectional view of a semiconductor laser apparatus according to the twelfth embodiment of the present invention. FIG. 30 is a plan cross-sectional view of the apparatus of FIG. 29 taken on the line A—A. In these figures, the lead 1, which is made of a metallic material, such as copper, with a thickness of 0.2 to 1.0 mm, includes the rectangular portion 3, the recesses 2 and the terminal portion 4. Since the lead 1 is formed by punching, burrs such as the front burr 40F and a rear burr 40R exist at its edge.

The beam receiving device 9 is made of, for example, a silicon crystal of PIN structure on which the surface electrode 11 and the reverse surface electrode 12 are provided. The surface electrode 11 is formed to be in ohmic contact with a beam receiving surface 65 constituted by a p-type diffusion region. The beam receiving device 9 is fixed onto the lead 1 through a conductive adhesive agent such as silver paste.

The semiconductor laser device 14 is fixed through silver paste or solder onto the beam receiving device 9 at its reverse surface electrode 12 so that the beam irradiating surface is situated at the front. The semiconductor laser device 14 is formed so that the reflectance of the reflective film of the rear surface is higher than that of the front surface in order that sub beam irradiation for monitoring is made from the rear surface. The beam receiving device 9 and the semiconductor laser device 14 mounted thereon constitute a device group 64.

The device group 64 is mounted on a surface of the lead 1 where no punching burrs exists. A front surface 61 of the device group 64, that is, the front surface of the beam receiving device 9 is in the rear of the front burr 40F of the lead 1. A rear surface 62 of the device group 64 is in front of the rear burr 40R of the lead 1.

The other leads 7 and 8, which are made of a metallic material such as copper, are situated in the recesses 2 of the lead 1 and extend in a direction opposite to the main irradiation direction of the semiconductor laser device 14. The first and second fine metallic wires, both of which are made of gold, are arranged to connect the semiconductor laser device 14 and the lead 7, and the surface electrode 11 of the beam receiving device 9 and the lead 8, respectively. A center line 67 of the beam optical axis, which is a line which connects the front and rear surfaces of the semiconductor laser device 14, shows the direction in which the irradiated beam advances. The first and second fine metallic wires 17 and 18 are allotted to the left and right sides, respectively, of the center line 67 of the beam optical axis of the semiconductor laser device 14. In FIGS. 29 and 30, the other reference designations denote parts the same as those of FIGS. 3 and 4, and description thereof will be omitted.

Subsequently, the thirteenth embodiment where the temperature rise of the beam receiving device is smaller than that of the above-described twelfth embodiment will be described with reference to FIG. 31. FIG. 31 is a side cross-sectional view of a semiconductor laser apparatus according to the thirteenth embodiment of the present invention. In this figure, the beam receiving device 9 is made of, for example, a silicon crystal of PIN structure provided with the surface electrode 11 and a reverse surface electrode 70. The surface electrode 11 is formed to be in ohmic contact with the beam receiving surface 65 constituted by a p-type diffusion region. The beam receiving device 9 is fixed onto the lead 1 through a conductive adhesive agent.

A submount 71, which is made of, for example, silicon, is provided with a surface electrode 72 and a reverse surface electrode 73, and is fixed onto the lead 1 through copper paste. As the submount 71, a material having an excellent conductivity may be used instead of silicon.

The semiconductor laser device 14 is fixed by alloying it with the surface electrode 72 of the submount 71 so that the main beam irradiating surface is situated at the front. As described above, the device group 64 is constituted by the beam receiving device 9, the submount 71 mounted at a position on the lead 1 which position is in front of the beam receiving device 9, and the semiconductor laser device 14 mounted thereon.

The device group 64 is mounted on a surface of the lead 1 where punching burrs exist. A front surface 75 of the device group 64, that is, the front surface of the submount 71 is in the rear of the front burr 40 of the lead 1. A rear surface 76 of the device group 64 is in front of the rear burr 60 of the lead 1. In this semiconductor laser apparatus, since the semiconductor laser device 14 and the beam receiving device 9 are arranged to be separate from each other, the temperature rise of the beam receiving device due to the temperature rise of the semiconductor laser device 14 is small. While the semiconductor laser device 14 is mounted through the submount 71 in this case, the semiconductor laser device 14 may be directly mounted on the lead 1. If the semiconductor laser device 14 is directly mounted, the heat radiation thereof will improve, and accordingly, the temperature rise can be restrained. As a result, the life of the semiconductor laser device 14 is prolonged.

As described above, in the twelfth and thirteenth embodiments, since the device group constituted by the semiconductor laser device, etc. is mounted on a surface of the lead 1 where burrs exist, the irradiated beam from the front surface of the semiconductor laser device is not interfered with by the burr. Since only the irradiated beam from the rear surface of the semiconductor laser device is received by the beam receiving surface for this reason, the quantity of the received beam becomes stable, so that the monitoring current becomes stable. As a result, the output of the semiconductor laser device can accurately be controlled.

By arranging the front and rear surfaces of the device group to be away from burrs of the lead, the device group can be closely mounted on the lead with no space therebetween. Since the heat radiation of the device group is excellent, the temperature rise of the semiconductor laser device is restrained, and accordingly, the life of the semiconductor laser device is prolonged. Moreover, since the temperature rise of the beam receiving device is also restrained, the beam receiving characteristic (monitoring current value for the quantity of a received beam) becomes stable, and accordingly, the monitoring current becomes further stable.

The above-described embodiments have a defect that the life of the semiconductor laser device is shortened. This defect will be explained with reference to, for example, FIG. 18. The fine metallic wire 17 is wire-bonded to the semiconductor laser device 14 and to the second lead 7 in order to connect the semiconductor laser device 14 and the lead 7. However, since the position of the semiconductor laser device is higher than that of the lead 7, a stroke of the wire bonder is longer to the lead 7 than to the semiconductor laser device 14. For this reason, the compression strength of the wire bonder is set at the position of the lead 7 where the compression strength is normally small due to the long stroke. Since, for this reason, the semiconductor laser device 14 is excessively compressed at the time of the bonding to the semiconductor laser device 14 where the stroke of the wire bonder is short, the semiconductor laser device 14 is damaged by the excessive compression, which shortens the life of the semiconductor laser device 14.

Figure 32:
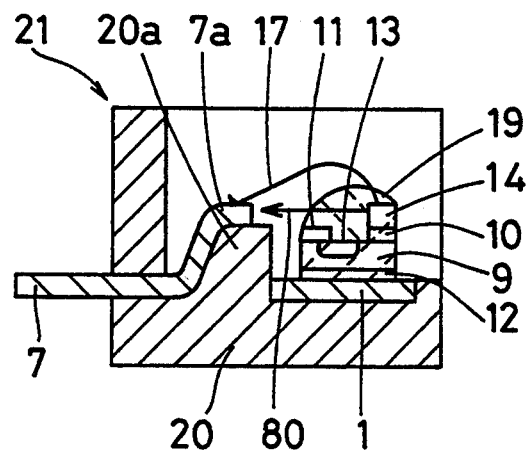
FIG. 32 is a side cross-sectional view of a semiconductor laser apparatus to a fourteenth embodiment of the present invention.
Figure 33:
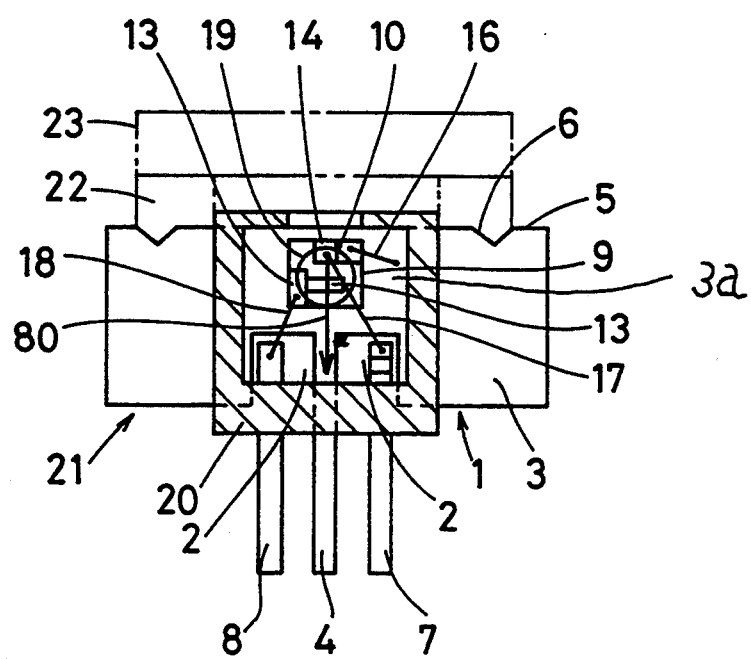
FIG. 33 is a plan cross-sectional view of the semiconductor laser apparatus according to the fourteenth embodiment.

In the subsequently-described fourteenth to seventeenth embodiments, such a defect has been removed. In FIGS. 32 and 33 showing the fourteenth embodiment, the basic structure of the fourteenth embodiment is the same as that of the fourth embodiment of FIG. 13, and the same parts thereof as appear in FIG. 13 are therefore identified by the same reference designations. In this embodiment, a part of the insulating frame 20 protrudes, and the protruding portion 20a supports an end portion of the second lead 7. The end portion of the lead 7 is formed into a crank form by pressing beforehand. The surface of a portion (bonding portion 7a) on the protruding portion 20a of the second lead 7 and the surface of the semiconductor laser device are situated at substantially the same height. The protruding portion 20a of the insulating frame 20 serves as a base for the second lead 7 at the time of the wire bonding in order to prevent the second lead 7 from deforming.

Figure 34:
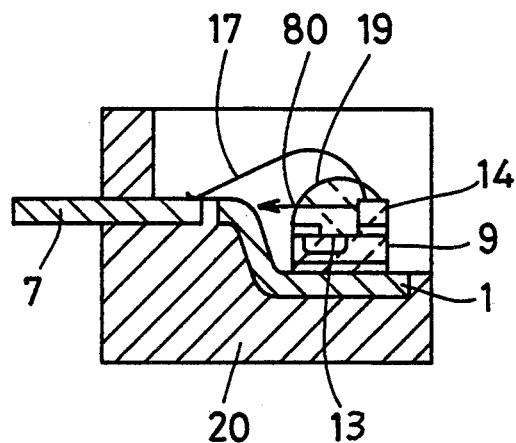
FIG. 34 is a side cross-sectional view of a semiconductor laser apparatus according to a fifteenth embodiment of the present invention.

Subsequently, the fifteenth embodiment of the present invention will be described with reference to the cross-sectional view of FIG. 34. The first lead 1 is partly formed into a crank form by pressing. The beam receiving device 9 is fixed onto the crank-form portion. The semiconductor laser device 14 is fixed onto the beam receiving device 9. The second lead 7, whose upper surface is situated at substantially the same height at which the upper surface of the semiconductor laser device 14 is situated, is of plate form. The fine metallic wire 17 is arranged to connect the semiconductor laser device 14 and the second lead 7. The insulating frame 20 is provided to integrally cover the first and second leads 1 and 7. The same parts of FIG. 34 as appear in FIGS. 32 and 33 are identified by the same reference designations. As described above, while, in the fourteenth embodiment, the lead 7 is formed so that a part thereof is higher than the other part thereof, in the fifteenth embodiment, the lead 1 is formed so that a part thereof is lower than the other part thereof.

Figure 35:
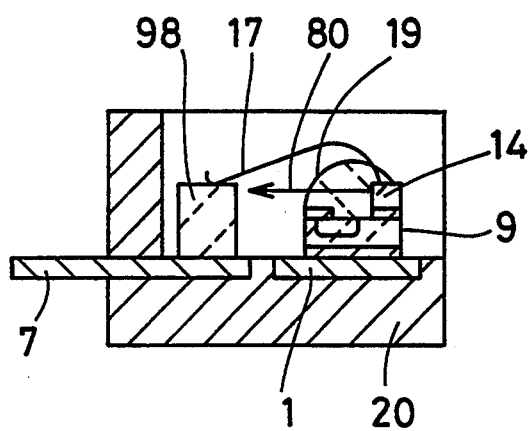
FIG. 35 is a side cross-sectional view of a semiconductor laser apparatus according to a sixteenth embodiment of the present invention.

Subsequently, the sixteenth embodiment of the present invention will be described with reference to the cross-sectional view of FIG. 35. The first lead 1 is formed to be of plate form. On the first lead 1, the beam receiving device 9 and the semiconductor laser device 14 are mounted in this order. The second lead 7 of plate form is arranged at substantially the same height at which the first lead 1 is arranged. A submount 98, which is made of silicon to which boron is added, is fixed onto the second lead 7. The upper surface of the submount 98 and the upper surface of the semiconductor laser device 14 are situated at substantially the same height. The fine metallic wire 17 is arranged to connect the upper surface of the submount 98 and the upper surface of the semiconductor laser device 14. The insulating frame 20 is provided to integrally cover the first and second leads 1 and 7. In this embodiment, unlike the fourteenth and fifteenth embodiments, it is unnecessary to provide the crank-form portions to the lead by pressing. However, since it is necessary to provide the submount 98, the cost is higher.

Figure 36:
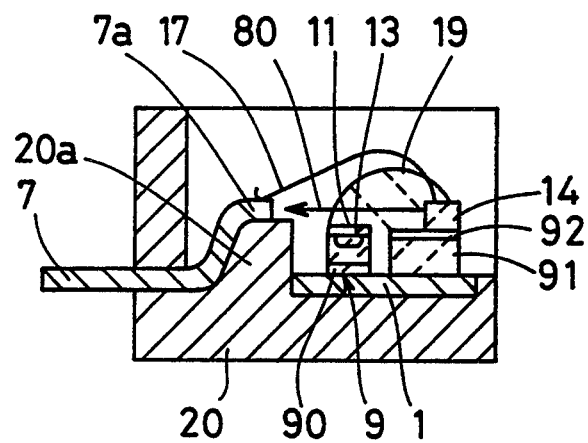
FIG. 36 is a side cross-sectional view of a semiconductor laser apparatus according to a seventeenth embodiment of the present invention.

Subsequently, the seventeenth embodiment of the present invention will be described with reference to FIG. 36. This embodiment is an improvement of the fifth embodiment of FIGS. 15 and 16 to which the structure of the fourteen embodiment of FIG. 32 is added. The same parts of this embodiment as appear in the fifth embodiment are identified by the same reference designations, and description thereof will be omitted.

As described above, in the fourteenth to seventeenth embodiments, by arranging the position of the semiconductor laser device and the wired position of the lead 7 to be at substantially the same height, in bonding by a wire bonder, the strokes of the wire bonder at the two positions become substantially the same. Consequently, the compression strength of the bonding to the lead 7 and that to semiconductor laser device can be set at substantially the same and appropriate value. Since sufficient bonding strengths can be secured both to the lead 7 and to the semiconductor laser device as a result, there is no possibility that the fine metallic wire is detached from the lead 7 or from the semiconductor laser device. Since excessive compression strength is not applied to the semiconductor laser device having a damageable active layer in the vicinity of its surface, no damage is caused to the semiconductor laser device. As a result, the life of the semiconductor laser device is prolonged.

Figure 1:
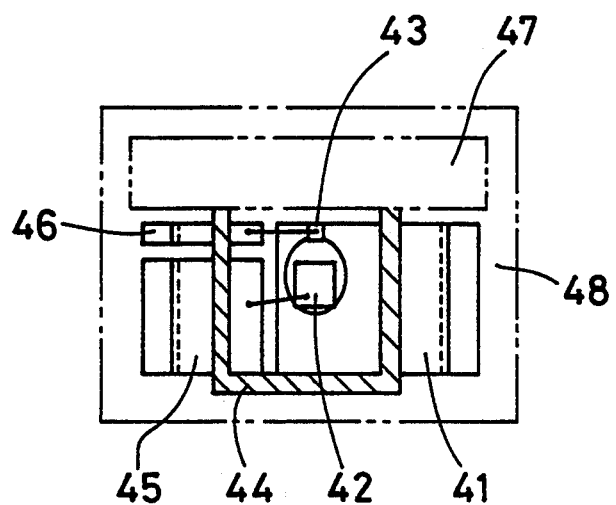
FIG. 1 is a plan cross-sectional view of a principal portion of a semiconductor laser apparatus shown in Japanese Patent Application No. H4-132513 by the present Applicants.
Figure 2:
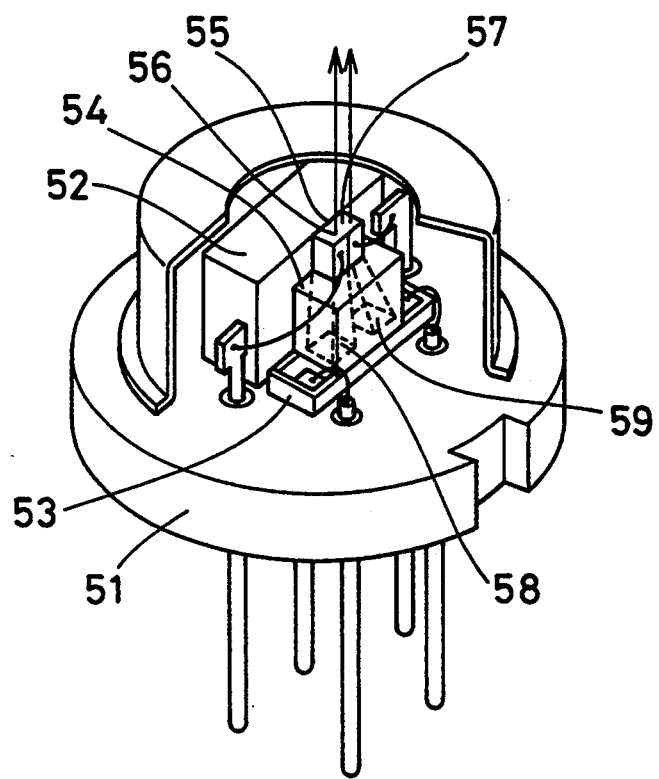
FIG. 2 is a partially broken perspective view of a conventional two-beam irradiating semiconductor laser apparatus.
Figure 37:
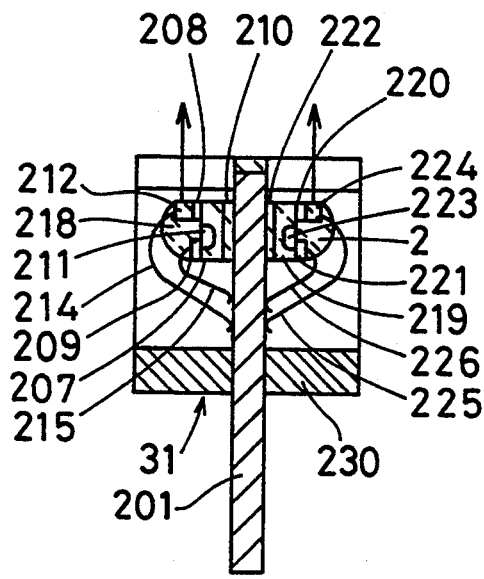
FIG. 37 is a side cross-sectional view of a semiconductor laser apparatus according to an eighteenth embodiment of the present invention.
Figure 38:
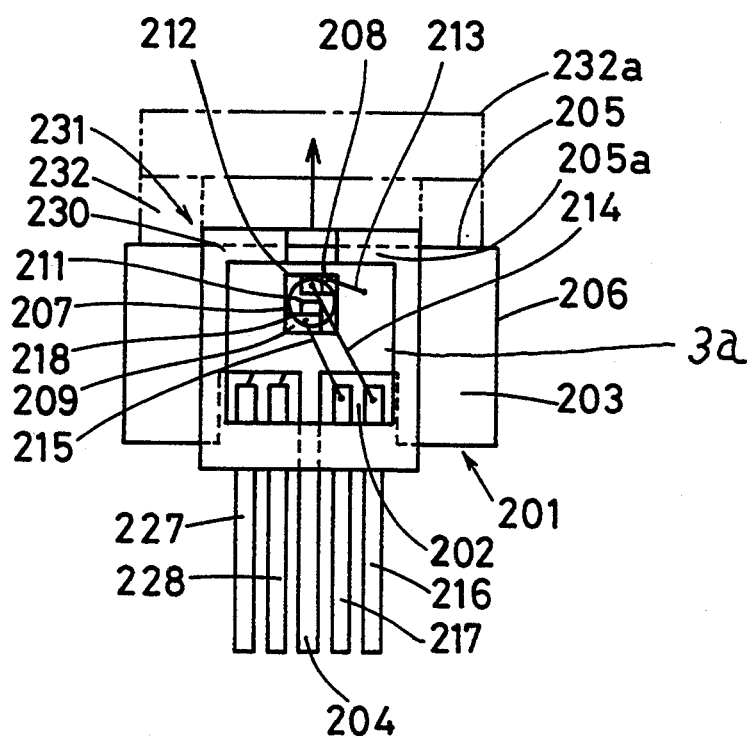
FIG. 38 is a plan cross-sectional view of the semiconductor laser apparatus according to the eighteenth embodiment.

Subsequently, eighteenth to nineteenth embodiments of the present invention will be described where the problem explained with reference to FIG. 2 has been solved. First, the eighteenth embodiment of the present invention will be described with reference to FIGS. 37 and 38. FIG. 37 is a cross-sectional view of a semiconductor laser apparatus according to the eighteenth embodiment of the present invention. FIG. 38 is a plan view of the apparatus of FIG. 37. In these figures, a lead 201, which is made of a metallic material, such as copper, with a thickness of 0.2 to 1.0 mm, includes recesses 202, a rectangular portion 203 and a terminal portion 204. The lead 201 may be made of iron or aluminum. Preferably, the lead 201 is provided with concave portions or convex portions at its edge 205 or 206.

A first beam receiving device 207 is made of, for example, a silicon crystal of PIN structure provided with surface electrodes 208 and 209 and a reverse surface electrode 210. The surface electrode 209 is formed to be in ohmic contact with a p-type diffusion region 211. The first beam receiving device 207 is fixed onto the lead 201 through a conductive adhesive agent such as silver paste. A first semiconductor laser device 212 is made of, for example, a GaAlAs beam emitting layer including a linear active layer and clad layers sandwiching the active layer. On each side of the first semiconductor laser device 207, which is cleaved, a reflective film is formed. The first semiconductor laser device 212 is fixed through silver paste or solder onto the surface electrode 208 of the first beam receiving device 207 so that its main beam irradiating surface is situated in the vicinity of the edge 205 of the lead 201. The terminal portion 204 of the lead 201 extends rearward, that is, in a direction opposite to the main beam irradiation direction (forward) of the semiconductor laser device 212.

Fine metallic wires 213, 214 and 215 are respectively arranged to connect the surface electrode 208 and the lead 201, a surface of the semiconductor laser device 212 and the lead 216, and the surface electrode 209 and the lead 217. A first transparent resin 218, which is made of, for example, epoxy resin, is formed to integrally cover from the vicinity of the rear surface of the semiconductor laser device 212 to the p-type diffusion region 211 of the first beam receiving device 207. By covering the above region with the first transparent resin 218, the laser beam irradiated from the rear surface of the semiconductor laser device 212 is reflected by the interface between the first transparent resin 218 and the atmosphere and incident on the p-type diffusion region 211 without failure. Since the quantity of the received beam increases as a result, the sensitivity of the first beam receiving device 207 improves.

A second beam receiving device 219 is made of a silicon crystal of PIN structure provided with surface electrodes 220 and 221 and a reverse surface electrode 222. The surface electrode 221 is formed to be in ohmic contact with a p-type diffusion region 223. The second beam receiving device 219 is fixed onto the lead 201 through a conductive adhesive agent. A second semiconductor laser device 224 is made of, for example, a GaAlAs beam emitting layer including a linear active layer and clad layers sandwiching the active layer. The second semiconductor laser device 224 is fixed through silver paste onto the surface electrode 220 so that its main beam irradiating surface is situated in the vicinity of the edge 205 of the lead 201.

Fine metallic wires 225 and 226 are respectively arranged to connect the surface of the semiconductor laser device 224 and the lead 227, and the surface electrode 221 and the lead 228. The surface electrode 220 and the lead 201 are connected by a fine metallic wire. A second transparent resin 229, which is made of, for example, epoxy resin, is formed to integrally cover from the vicinity of the rear surface of the semiconductor laser device 224 to the p-type diffusion region 223 of the second beam receiving device 219.

An insulating frame 230, which is made of, for example, polycarbonate resin or epoxy resin, is formed by transfer molding to be U-shaped so that the beam irradiating surfaces of the first and second semiconductor laser devices 212 and 214 are exposed, and to nip the obverse and reverse surfaces of each of the leads 216, 217, 227 and 228. The insulating frame 230 may be made of alumina ceramics or an insulation-processed metallic material. The above-described parts constitute the semiconductor laser apparatus 231.

Since a region 205a in the vicinity of the edge 105 of the lead 201 is sufficiently strong since it is formed integrally with the insulating frame 230 so that its obverse and rear surfaces are nipped by the insulating frame 230. For this reason, when the above-mentioned six metallic wires are bonded by a wire bonder, portions of the lead 201 where the devices are mounted do not deformed.

The semiconductor laser apparatus 231 may be fixed onto a supporter 232 so that convex portions or concave portions formed on the supporter 232 and concave portions or convex portions formed at the edge 205 of the lead 201 engage with each other. With this arrangement, since the position shift of the semiconductor laser device 231 does not occur, the position relationship between the irradiated beam and an optical part 232a provided at an opening of the supporter 232 is accurately held.

Figure 39:
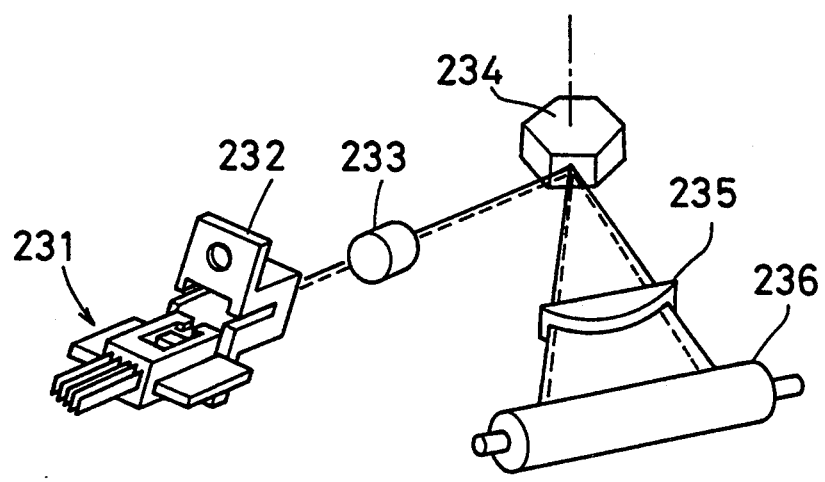
FIG. 39 is a schematic view showing a laser beam printer employing the semiconductor laser apparatus according to the eighteenth embodiment.

Subsequently, a laser beam printer employing the semiconductor laser apparatus 231 will be described with reference to FIG. 39. The main beam irradiated from the semiconductor laser apparatus 231 supported by the supporter 232 is modulated by an optical modulator 233 consisting of a collimator lens and a cylindrical lens. The modulated beam is deflected by a rotating polygonal mirror 234. After the equal angular velocity deflection thereof is converted to equal speed linear scanning, the beam is converged to have a predetermined spot diameter by passing through an F$\theta$ lens 235. The converged beam is irradiated onto a photoreceptor applied onto a rotating drum 236. The irradiated portion is formed into a latent image by a decrease of the charged potential and recorded. Since the semiconductor laser apparatus 231 irradiates two main laser beams (represented by a solid line and a dotted line, respectively), two straight line portions on the rotating drum 236 are simultaneously irradiated, and accordingly, the printing speed doubles.

Figure 40:
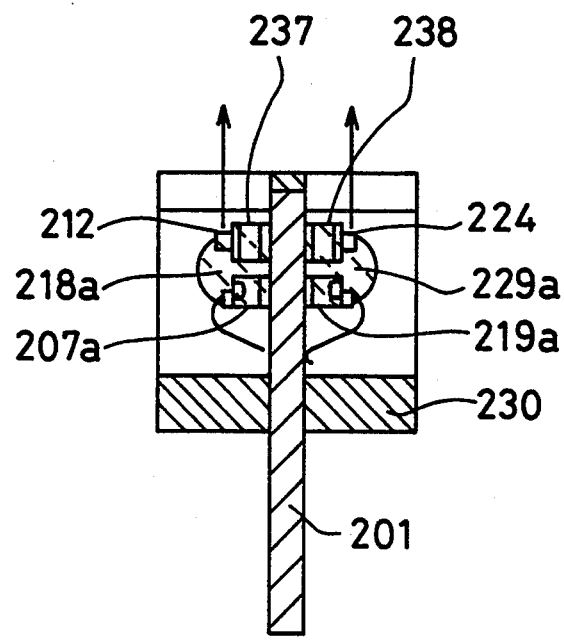
FIG. 40 is a side cross-sectional view of a semiconductor laser apparatus according to a nineteenth embodiment of the present invention.

Subsequently, the nineteenth embodiment where the temperature rise of the beam receiving device is smaller than that of the above-described eighteenth embodiment will be described with reference to FIG. 40. FIG. 40 is a cross-sectional view of a semiconductor laser apparatus according to the nineteenth embodiment of the present invention. In this figure, a first beam receiving device 207a, which is made of, for example, a silicon crystal of PIN structure provided with an electrode on each of its obverse and reverse surfaces, is fixed onto the surface of the lead 201 through a conductive adhesive agent. The first semiconductor laser device 212 is fixed by alloying it with a surface electrode of the submount 237. As described above, the first semiconductor laser device 212 is mounted through the submount 237 at a position on the lead 201 which position is in front of the first beam receiving device 207a. A first transparent resin 218a is formed to integrally cover from the vicinity of the rear surface of the first semiconductor laser device 212 to the beam receiving surface of the first beam receiving device 207a.

The second semiconductor laser device 224 is mounted through the submount 238 at a position on the reverse surface of the lead 201 which position is in front of the second beam receiving device 219a. A second transparent resin 229a is formed to integrally cover from the vicinity of the rear surface of the second semiconductor laser device 224 to the beam receiving surface of the second beam receiving device 219a. Since the first and second semiconductor laser devices 212 and 224 are arranged on the obverse and reverse surfaces of the lead 201 separately from the beam receiving devices 207a and 219a, respectively, as described above, the temperatures of the first and second beam receiving devices 207a and 219a do not increase so much with the increase in the temperatures of the first and second semiconductor laser devices 212 and 224. Since the characteristic (monitoring current value for the quantity of a received beam) becomes stable, the monitoring current becomes stable, and accordingly, the outputs of the semiconductor laser devices 212 and 224 can accurately be controlled.

When the amount of the received beams is sufficient, the first and second semiconductor laser devices 212 and 224 may be directly mounted on the obverse and reverse surfaces of the lead 201 without providing the submounts 237 and 238. With this arrangement, the distance between the two beams can be decreased.

In the eighteenth and nineteenth embodiments, since the first and second semiconductor laser devices are provided to the obverse and reverse surfaces of the lead, respectively, two beams are easily obtained. As a result, when this semiconductor laser apparatus is used in a laser printer, the printing speed doubles. Moreover, since it is necessary to provided only one main beam emitting portion to each of the first and second semiconductor laser devices and it is necessary to provide only one sub beam receiving surface to each of the first and second beam receiving devices for receiving the sub beams from the rear surfaces of the semiconductor laser devices in order to control the outputs of the semiconductor laser devices, the cost is low. Further, since the positioning is easy, the manufacture is easy.

Since the first and second beam receiving devices are provided to the obverse and reverse surfaces of the lead, the beams incident on the beam receiving devices do not overlap with each other. As a result, the outputs of the semiconductor laser devices can accurately be controlled, it is not necessary to provide any part for separating the two beams to be incident on the beam receiving devices. Specifically, the cost of the conventional two-beam irradiating semiconductor laser apparatus is ten times as much as that of a one-beam type, whereas the cost of the apparatus of the present invention is only twice as much as the one-beam type.

Figure 41:
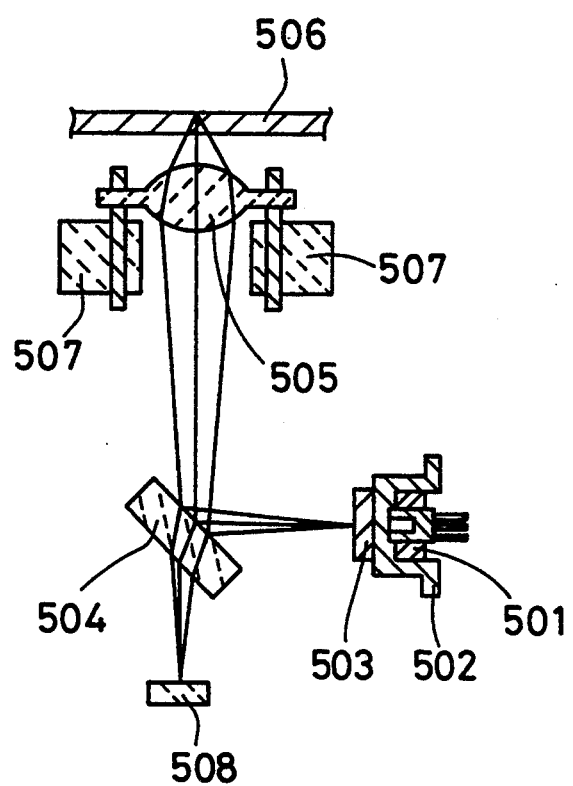
FIG. 41 is a schematic view showing a pickup apparatus for use in a compact disc reproducing apparatus employing a semiconductor laser apparatus of the present invention.

Subsequently, an application product employing a semiconductor laser apparatus of the present invention will be described. First, a pickup apparatus for use in a compact disc reproducing apparatus will be described with reference to FIG. 41. FIG. 41 is a cross-sectional view of the pickup apparatus. A semiconductor laser apparatus 501 is fixed to a supporter 502. A diffraction grating 503 is fitted into an opening formed in the supporter 502. A beam irradiated from the semiconductor laser apparatus 501 is divided into three beams by the diffraction grating 503. Then, the beams reflected by a half mirror 504 are incident on an objective lens 505, and converged on a disc 506. The objective lens 505 is driven leftward and rightward by a focus coil 507 so that the signals on the disc 506 are accurately read. The laser beam modulated by a pit of the disc 506 passes through the objective lens 505 and the half mirror 504, and advances toward a beam receiving device 508. Astigmatism has already been generated under this condition. By deforming the beam by means of the half mirror 504, a defocus amount can be detected. The beam is converted from a light signal to an electric signal by the beam receiving device 508, and outputted as a current. By processing this signal by means of an RF (radio frequency) amplifier and a servo amplifier, an RF signal (pit information) and a servo signal are obtained.

Figure 42:
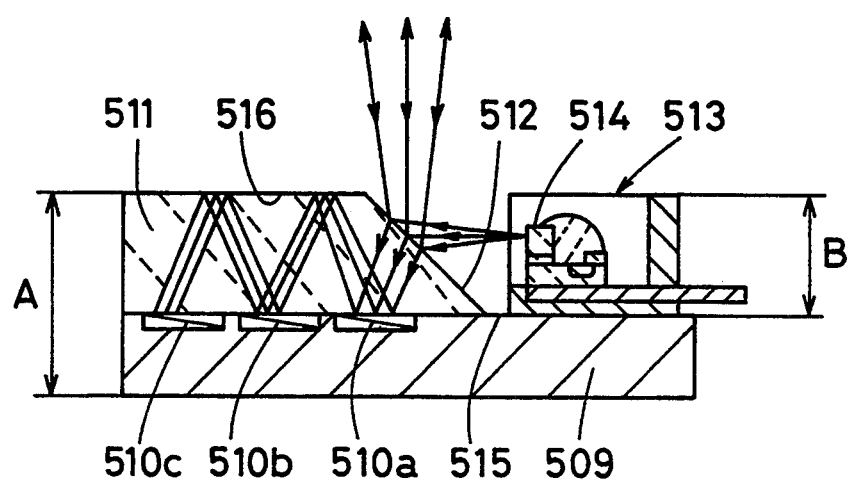
FIG. 42 is a side cross-sectional view of another pickup apparatus for use in a compact disc reproducing apparatus employing a semiconductor laser apparatus of the present invention.

Subsequently, a pickup apparatus which is of a smaller size than the above-described pickup apparatus will be described with reference to FIG. 42. FIG. 42 is a cross-sectional view of the pickup apparatus. Beam receiving regions 510a, 510b and 510c are formed separately from one another on the upper surface of a semiconductor substrate 509 made of silicon. A prism 511 is fixed onto the semiconductor substrate 509 through transparent adhesive agent (not shown). One side surface of the prism 511 is formed to incline (an inclining surface 512). A semiconductor laser apparatus 513 of the present invention is fixed to the upper surface of the semiconductor substrate 509 through insulating adhesive agent (not shown). A laser beam irradiated from a semiconductor laser device 514 of the semiconductor laser apparatus 513 is reflected by the inclining surface 512. The reflected beam passes through a non-illustrated objective lens and is reflected by a disc. After passing through the objective lens again, the beam returns to the inclining surface 512. A part of the returned beam passes through the inclining surface 512 and is incident on a surface 515. A part of the beam is incident on the beam receiving region 510a, while the other part is internally reflected by the surface 515. The internally reflected beam is reflected by a surface 516 and again incident on the surface 515, and a part thereof is incident on the beam receiving region 510b. The other part is reflected by the surfaces 515 and 516, and incident on the beam receiving region 510c.

Since the prism 511 having the inclining surface 512 is mounted on the semiconductor substrate 509 on which the beam receiving regions 510a, 510b and 510c are formed, a thin apparatus with a height A of approximately 3 to 4 mm is obtained. As previously described, the thickness B of the semiconductor laser apparatus of the present invention is approximately 2 to 3 mm, which is thin compared to a conventional can-type laser apparatus with a thickness of approximately 6 to 7 mm. For this reason, by employing the semiconductor laser apparatus 513, a thin pickup apparatus with a thickness of 3 to 4 mm can be obtained.

Further, if the thin semiconductor laser apparatus of the present invention with a thickness of approximately 2 to 3 mm is employed in, for example, a pointer or a bar code reading apparatus, a thin application product will be realized.

Obviously, many modifications and variations of the present invention are possible in light of the above teachings. It is therefore to be understood that within the scope of the appended claims, the invention may be practiced other than as specifically described.

What is claimed is:

1. A semiconductor laser apparatus comprising:
a lead having a mount surface and a positioning means, said positioning means being provided at a periphery of the mount surface;
a beam receiving device mounted on the mount surface of the lead;
a semiconductor laser device mounted on the lead so that a beam optical axis thereof is situated at a position higher than a position at which a beam receiving surface of the beam receiving device is situated, said semiconductor laser device having a beam irradiating surface at each of its front and rear, a laser beam irradiated from the rear irradiating surface being led to the beam receiving surface of the beam receiving device; and
an insulating frame formed to partly cover the lead and to nip an obverse surface and a reverse surface of the lead so that at least the front irradiating surface of the semiconductor laser device is exposed.

2. A semiconductor laser apparatus according to claim 1, wherein a molding resin is provided which covers at least from the rear surface of the semiconductor laser device to the beam receiving surface of the beam receiving device, said molding resin being made of a transparent resin.

3. A semiconductor laser apparatus according to claim 2, wherein said transparent resin contains a dispersing agent.

4. A semiconductor laser apparatus according to claim 1, wherein a molding resin is provided which covers at least from the rear surface of the semiconductor laser device to the beam receiving surface of the beam receiving device, said molding resin being made of an ultraviolet hardened resin.

5. A semiconductor laser apparatus according to claim 4, wherein said ultraviolet hardened resin contains a dispersing agent.

6. A semiconductor laser apparatus according to claim 1, wherein an internal wall of the insulating frame inclines outward.

7. A semiconductor laser apparatus according to claim 1, wherein an external wall of the insulating frame inclines frontward.

8. A semiconductor laser apparatus according to claim 1, wherein the semiconductor laser device and the beam receiving device are mounted on a surface of the lead reverse to a surface thereof where a burr exists.

9. A semiconductor laser apparatus according to claim 1, wherein the semiconductor laser device is directly mounted at a position on the lead which position is in front of the beam receiving device.

10. A semiconductor laser apparatus according to claim 1, wherein the semiconductor laser device is mounted through a submount at a position on the lead which position is in front of the beam receiving device.

11. A semiconductor laser apparatus according to claim 1, further comprising:
another beam receiving device mounted on the reverse surface of the lead; and
another semiconductor laser device mounted on the reverse surface of the lead so that a beam optical axis thereof is situated at a position higher than a position at which said another beam receiving device is situated, said another semiconductor laser device having a beam irradiating surface at its front and rear,
wherein said insulating frame is integrally formed to partly cover the lead and to nip the obverse and reverse surfaces of the lead so that at least the front irradiating surface of each of the two semiconductor laser devices are exposed.

12. A semiconductor laser apparatus according to claim 1, wherein said lead is a main lead, and separately from the main lead, a first another lead and a second another lead are provided separately, wherein a transparent resin is provided which covers at least from the rear surface of the semiconductor laser device to the beam receiving surface of the beam receiving device, and wherein a first fine metallic wire connecting the semiconductor laser device and the first another lead and a second fine metallic wire connecting the beam receiving device and the second another lead are provided, and said first and second fine metallic wires are allotted to a left side and a right side, respectively, of the center of the beam optical axis of the semiconductor laser device.

* * * * *